(12) United States Patent
Cheon

(10) Patent No.: US 11,597,190 B2
(45) Date of Patent: Mar. 7, 2023

(54) PROTECTIVE FILM AND COVER WINDOW INCLUDING THE SAME

(71) Applicant: Samsung Display Co., LTD., Yongin-si (KR)

(72) Inventor: Kyu Hyeong Cheon, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 440 days.

(21) Appl. No.: 16/745,236

(22) Filed: Jan. 16, 2020

(65) Prior Publication Data

US 2020/0290325 A1    Sep. 17, 2020

(30) Foreign Application Priority Data

Mar. 12, 2019  (KR) ......................... 10-2019-0027962

(51) Int. Cl.
*B32B 27/08* (2006.01)
*B32B 7/12* (2006.01)
*H05K 5/03* (2006.01)

(52) U.S. Cl.
CPC ............... *B32B 27/08* (2013.01); *B32B 7/12* (2013.01); *H05K 5/03* (2013.01); *B32B 2457/20* (2013.01)

(58) Field of Classification Search
CPC .. B32B 3/04; B32B 3/266; B32B 7/12; B32B 23/08; B32B 23/20; B32B 27/08; B32B 27/281; B32B 27/286; B32B 27/302; B32B 27/304; B32B 27/306; B32B 27/308; B32B 27/325; B32B 27/36; B32B 27/365; B32B 2250/24; B32B 2255/10; B32B 2255/20; B32B 2255/26; B32B 2307/412; B32B 2307/732; B32B 2457/20; B32B 2571/00; G02B 1/14; G02F 1/1333; H01L 21/6835; H01L 2221/68354; H04M 1/0266; H04M 1/185; H04M 2250/12; H05K 5/03
See application file for complete search history.

(56) References Cited

U.S. PATENT DOCUMENTS 4,934,054 A   6/1990  Morozumi
2017/0146710 A1 * 5/2017  Jin ..................... H04M 1/0266

FOREIGN PATENT DOCUMENTS

WO   WO-2018045353 A1 *  3/2018 ............. B32B 27/06

* cited by examiner

*Primary Examiner* — Christopher M Polley
*Assistant Examiner* — Sathavaram I Reddy
(74) *Attorney, Agent, or Firm* — Cantor Colburn LLP

(57) ABSTRACT

A cover window includes a protective film including a first protective member, an adhesive layer disposed on the first protective member, a second protective member disposed on at least a part of the adhesive layer, at least one cut line in which at least a part thereof is spaced apart from the second protective member and faces the second protective member and which includes ends spaced apart from each other, and at least one bridge portion disposed in an area in which the cut lines are spaced apart from each other.

20 Claims, 23 Drawing Sheets

PROTECTIVE FILM AND COVER WINDOW INCLUDING THE SAME

This application claims priority to Korean Patent Application No. 10-2019-0027962, filed on Mar. 12, 2019, and all the benefits accruing therefrom under 35 U.S.C. § 119, the content of which in its entirety is herein incorporated by reference.

BACKGROUND

1. Field

Exemplary embodiments of the invention relate to a protective film and a cover window including the protective film. More particularly, exemplary embodiments of the invention relate to a protective film including cut lines and a bridge portion between the cut lines, and a cover window including the protective film.

2. Description of the Related Art

An importance of a display device has increased with a development of multimedia. Accordingly, various types of display devices such as an organic light emitting display ("OLED") and a liquid crystal display ("LCD") have been used. Such display devices may be used for various mobile electronic appliances such as smart phones, smart watches, and tablet personal computers ("PCs").

In various display devices used for mobile electronic appliances, a cover window is transparent such that a user may see a display unit is disposed in front of a display panel. The display panel may include a display area where an actual image is displayed and a non-display area other than the display area. The cover window may include a light transmitting area corresponding to the display area of the display panel and an opaque light blocking area corresponding to the non-display area of the display panel.

A mobile electronic appliance is equipped with a large number of components such as a speaker, a camera, a proximity sensor, a physical button, an electrostatic button, and a microphone in addition to a display device. These components are located on or behind the light blocking area of a cover window, and the cover window is provided with various holes to perform functions of the components. In this case, a protective film including a masking film for protecting such holes may be attached to a back surface of the cover window.

The protective film includes a protective substrate and a masking film, and includes an adhesive layer for attaching the masking film to the protective substrate. The protective film may be manufactured by partially removing the removing the protective substrate and the release paper disposed on and beneath the adhesive layer to attach the masking film to the protective substrate.

SUMMARY

When a release paper is removed from a protective film is removed, a part of an adhesive layer is die-cut to remove the release paper, and thus there has been a problem that a lifting phenomenon occurs in a die-cut area of the adhesive layer.

An exemplary embodiment of the invention is to provide a protective film which includes cut lines obtained by completely cutting a part of an adhesive layer and a bridge portion disposed between the cut lines and including the non-cut adhesive layer.

Another exemplary embodiment of the invention is to provide a cover window to which the protective film is attached.

However, exemplary embodiments of the invention are not restricted to the one set forth herein. The above and other exemplary embodiments of the invention will become more apparent to one of ordinary skill in the art to which the invention pertains by referencing the detailed description of the invention given below.

An exemplary embodiment of the invention provides a protective film including a first protective member, an adhesive layer disposed on the first protective member, a second protective member disposed on at least a part of the adhesive layer, at least one cut line in which at least a part thereof is spaced apart from the second protective member and faces the second protective member and which includes ends spaced apart from each other, and at least one bridge portion disposed in an area in which the cut lines are spaced apart from each other.

In an exemplary embodiment, the cut line may extend in a direction perpendicular to an upper surface of the adhesive layer, and the adhesive layer may include a cut area in which at least a part thereof is cut and overlaps the cut line.

In an exemplary embodiment, the cut line may extend to a lower surface of the first protective film, and the first protective member may include the cut area in which at least a part thereof is cut.

In an exemplary embodiment, the first protective member and the adhesive layer may not be cut in an area overlapping the bridge portion.

In an exemplary embodiment, a width between the second protective member and the adhesive layer may be in a range of about 0.1 millimeter (mm) to about 0.3 mm.

In an exemplary embodiment, the protective film may include a first area in which the second protective member is disposed and a second area other than the first area with respect to the cut line, and the bridge portion may be disposed between the first area and the second area.

In an exemplary embodiment, the cut line may include a first cut line, and a second cut line spaced apart from the first cut line, and the bridge portion may include a first bridge portion disposed between a first end of the first cut line and a second end of the second cut line, and a second bridge portion disposed between a third end of the first cut line and a fourth end of the second cut line.

In an exemplary embodiment, the second end of the second cut line may be placed on an extension line of the first end of the first cut line.

In an exemplary embodiment, an extension line of the third end of the first cut line may be spaced apart from an extension line of the fourth end of the second cut line in a direction different from an extension direction.

In an exemplary embodiment, a width of the bridge portion may have a range of about 2 mm to about 5 mm.

In an exemplary embodiment, the protective film may further include a sub-cut line connecting both ends of the cut line, the sub-cut line may extend in a direction perpendicular to the upper surface of the adhesive layer and be spaced apart from a lower surface of the adhesive layer.

In an exemplary embodiment, the sub-cut line may have a shape symmetrical to the cut line with respect to a reference line overlapping at least a part of the second protective member and across both of the ends of the cut line.

An exemplary embodiment of the invention provides a cover window including a base layer, a first print layer disposed on one surface of the base layer and including at least one first hole for exposing at least a part of the one surface, and a protective film at least partially disposed on the first print layer, the protective film includes a first protective member disposed on the one surface of the base layer, a second protective member disposed between the first protective film and the one surface and overlapping at least a part of the first print layer, an adhesive layer disposed between the first protective member and the second protective member, at least one cut line in which at least a part thereof is spaced apart from the second protective member and faces the second protective member and which includes ends spaced apart from each other, and at least one bridge portion disposed in an area in which the cut lines are spaced apart from each other.

In an exemplary embodiment, the one surface of the base layer may be in contact with the adhesive layer and the second protective member, and the area overlapping the cut line may be spaced apart from the cut line.

In an exemplary embodiment, the cut line may extend in a direction perpendicular to an upper surface of the adhesive layer, and the adhesive layer may include a cut area in which at least a part thereof is cut and overlaps the cut line.

In an exemplary embodiment, the first protective member and the adhesive layer may not be cut in an area overlapping the bridge portion.

In an exemplary embodiment, a thickness of the second protective member may have a range of about 0.05 mm to about 0.10 mm.

In an exemplary embodiment, the base layer may include a light blocking area in which the first print layer is disposed, and a light transmitting area other than the light blocking area.

In an exemplary embodiment, the protective film may be disposed on the light blocking area and the light transmitting area, the first hole may be defined in the light blocking area, and the second protective member may cover the first hole.

In an exemplary embodiment, the cover window may further include a second print layer disposed in the light transmitting area, the second print layer may include at least one second hole which exposes at least a part of the one surface of the base layer, and the second protective member may cover the second hole.

BRIEF DESCRIPTION OF THE DRAWINGS

The above and other exemplary embodiments and features of the invention will become more apparent by describing in detail exemplary embodiments thereof with reference to the attached drawings, in which.

DETAILED DESCRIPTION

Figure 1:
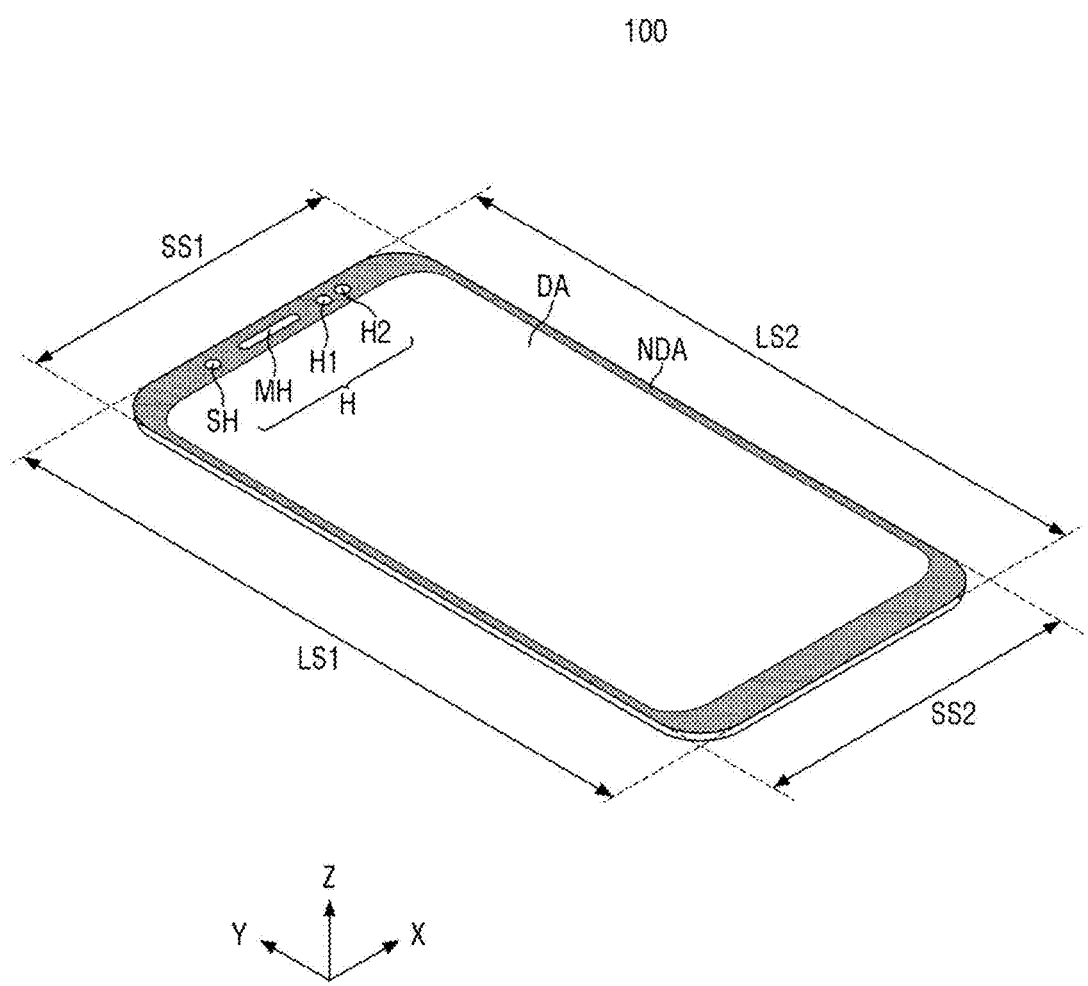
FIG. 1 is a perspective view of an exemplary embodiment of a cover window.

The invention will now be described more fully hereinafter with reference to the accompanying drawings, in which preferred embodiments of the invention are shown. This invention may, however, be embodied in different forms and should not be construed as limited to the exemplary embodiments set forth herein. Rather, these embodiments are provided so that this invention will be thorough and complete, and will fully convey the scope of the invention to those skilled in the art.

It will also be understood that when a layer is referred to as being "on" another layer or substrate, it may be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

In this specification, the "on", "over", "top", "upper side", or "upper surface" refers to a Z-axis direction, and the "beneath", "under", "bottom", "lower side", or "lower surface" refers to a direction opposite to the Z-axis direction. Further, the "left", "right", "upper", and "lower" refer to directions when viewed from the plane. For example, the "left" refers to a direction opposite to an X-axis direction, the "right" refers to the X-axis direction, the "upper" refers to a Y-axis direction, and the "lower" refers to a direction opposite to the Y-axis direction.

The terminology used herein is for the purpose of describing particular embodiments only and is not intended to be limiting. As used herein, the singular forms and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the attached drawings.

FIG. 1 is a perspective view of an exemplary embodiment of a cover window.

Referring to FIG. 1, a cover window 100 may have a rectangular shape in a plane. In an exemplary embodiment, the cover window 100 may have a rectangular shape in which corners in the plane are vertical, or a rectangular shape in which corners in the plane are round, for example.

The cover window 100 may include long sides LS1 and LS2 facing in parallel to each other and extending in a second direction (Y-axis direction) and short sides SS1 and SS2 facing in parallel to each other and extending in a first direction (X-axis direction). For convenience of explanation, as shown in FIG. 1, the left long side in the plane refers to a first long side LS1, the right side in the plane refers to a second long side LS2, the upper side in the plane refers to a first short side SS1, and the lower side in the plane refers to a second short side SS2. In an exemplary embodiment, the lengths of the long sides LS1 and LS2 of the cover window 100 may be longer than the lengths of the short sides SS1 and SS2 thereof, and the lengths of the long sides LS1 and LS2 thereof may be in a range of about 1.5 times to about 2.5 times the length of the short sides SS1 and SS2 thereof, for example. However, the invention is not limited thereto.

Further, as shown in FIG. 1, the cover window 100 may have a shape in which one surface of a cross-section is flat and each outer side is not rounded. However, the invention is not limited thereto, and in some cases, the cover window may have shape in which outer sides are rounded to have a predetermined curvature, or a shape in which outer sides are entirely rounded.

Figure 24:
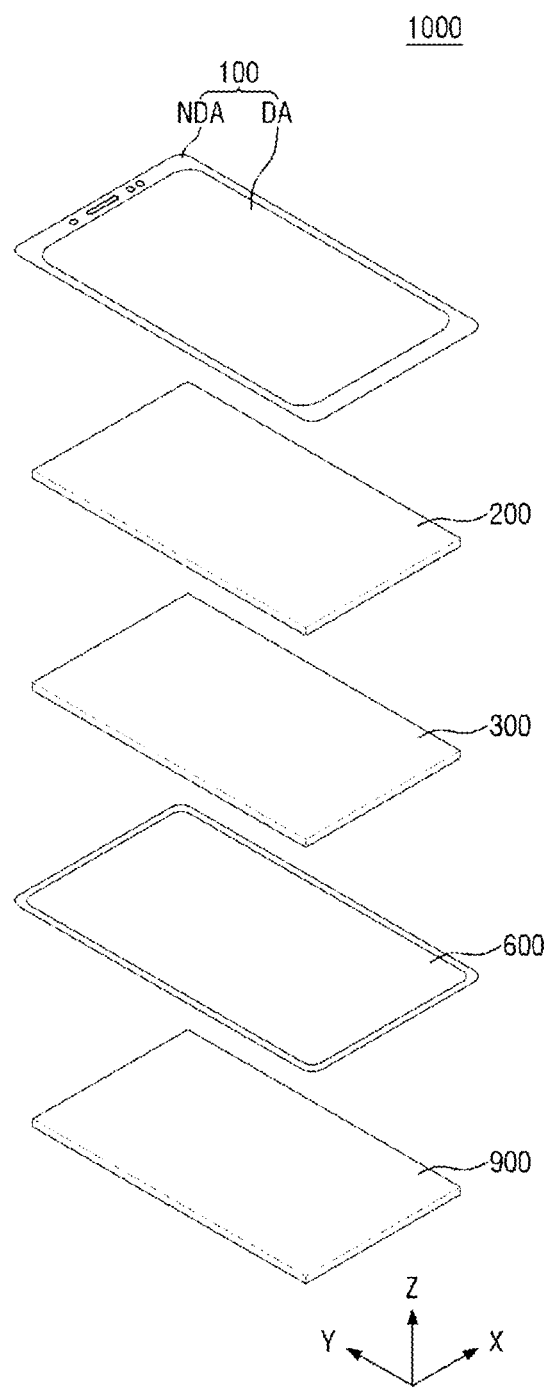
FIG. 24 is an exploded perspective view of an exemplary embodiment of a display device including a cover window.

The cover window 100 may include a transparent material such that a series of information may be displayed on the display member 300 (shown in FIG. 24). In an exemplary embodiment, the cover window 100 may include glass or plastic, for example. When the cover window 100 includes a plastic material, the cover window 100 may have flexible properties.

Examples of plastics applicable to the cover window 100 may include, but are not limited to, polyimide, polyacrylate, polymethylmethacrylate ("PMMA"), polycarbonate ("PC"), polyethylenenaphthalate ("PEN"), polyvinylidene chloride, polyvinylidene difluoride ("PVDF"), polystyrene, an ethylene vinylalcohol copolymer, polyethersulphone ("PES"), polyetherimide ("PEI"), polyphenylene sulfide ("PPS"), polyallylate, tri-acetyl cellulose ("TAC"), and cellulose acetate propionate ("CAP").

When the cover window 100 includes plastic, the cover window may further include a coating layer (not shown) on the upper and lower surfaces thereof. In an exemplary embodiment, the coating layer may be a hard coating layer including an organic layer and/or an organic-inorganic composite layer each including an acrylate compound. The organic layer may include an acrylate compound. In an exemplary embodiment, the organic-inorganic composite layer may be a layer in which an inorganic material such as silicon oxide, zirconium oxide, aluminum oxide, tantalum oxide, niobium oxide, or glass beads is dispersed in an organic material such as an acrylate compound. In another exemplary embodiment, the coating layer may include a metal oxide layer. In an exemplary embodiment, the metal oxide layer may include metal oxide such as titanium oxide, aluminum oxide, molybdenum oxide, tantalum oxide, copper oxide, indium oxide, tin oxide, or tungsten oxide, but the invention is not limited thereto.

The cover window 100 may include a light transmitting area DA corresponding to the display area of the display member 300 and a light blocking area NDA corresponding to an area other than the display member 300.

The light blocking area NDA may be disposed along the outer periphery of the cover window 100 such that the light blocking area NDA surrounds the light transmitting area DA. However, the invention is not limited thereto. The light blocking area NDA may include a material that absorbs or blocks light emitted from the display member 300 to block light incident toward the light blocking area NDA.

A plurality of holes H for exposing a front camera, an infrared sensor, an iris recognition sensor, an ultrasonic sensor, and an illuminance sensor may be defined in the light blocking area NDA. In an exemplary embodiment, first and second holes H1 and H2 for exposing the front camera, a sensor hole SH for exposing the above sensors, and a speaker hole MH for exposing a front speaker may be arranged in the light blocking area NDA of the cover window 100, for example. In an exemplary embodiment, the plurality of holes H, the speaker hole MH, and the sensor hole SH may be arranged in one side of the light blocking area NDA, for example, in the light blocking area adjacent to the first short side SS1 of the cover window 100. However, the invention is not limited thereto. The plurality of holes H, the speaker hole MH, and the sensor hole SH may be arranged in the light blocking area NDA adjacent to the second short side and first and second long sides of the cover window 100, or may be arranged to be dispersed in the plurality of light blocking areas NDA. When the sensors are embedded in the display member 300, some or all of the above holes H may be omitted.

The cover window 100 may include a protective film 10 (shown in FIG. 2) disposed to protect at least one surface thereof. The protective film 10 is disposed to protect at least one surface of the cover window 100. The protective film 10 may include a protective base layer for protecting the plurality of holes H arranged in the cover window 100, and the protective base layer may be disposed to overlap the holes H arranged in the protective base layer.

Figure 2:
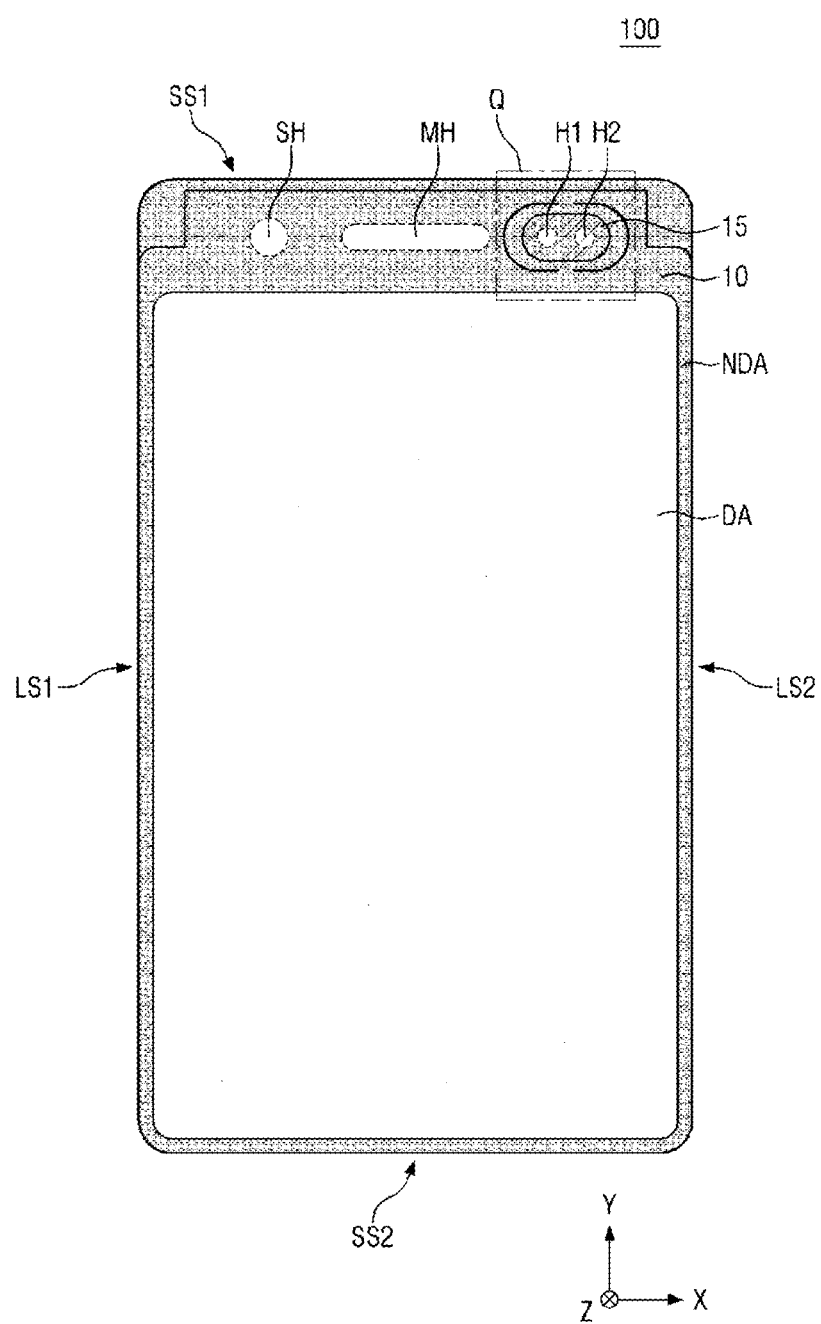
FIG. 2 is a schematic view illustrating an exemplary embodiment of the bottom of a cover window.

FIG. 2 is a schematic view illustrating the bottom of an exemplary embodiment of a cover window.

Referring to FIG. 2, the cover window 100 may include a protective film 10 and a first hole H1, a second hole H2, a speaker hole MH, a sensor hole SH may be defined in the cover window 100. The protective film 10 may be disposed on one surface of the cover window 100 in the third direction (Z-axis direction), for example, on the lower surface thereof.

Although not shown, the speaker hole MH may be a hole (that is, a physical hole) having a shape in which a base layer 110 is penetrated. The speaker hole MH may emit sound or voice made by a speaker (not shown) to the outside of the display device.

Figure 8:
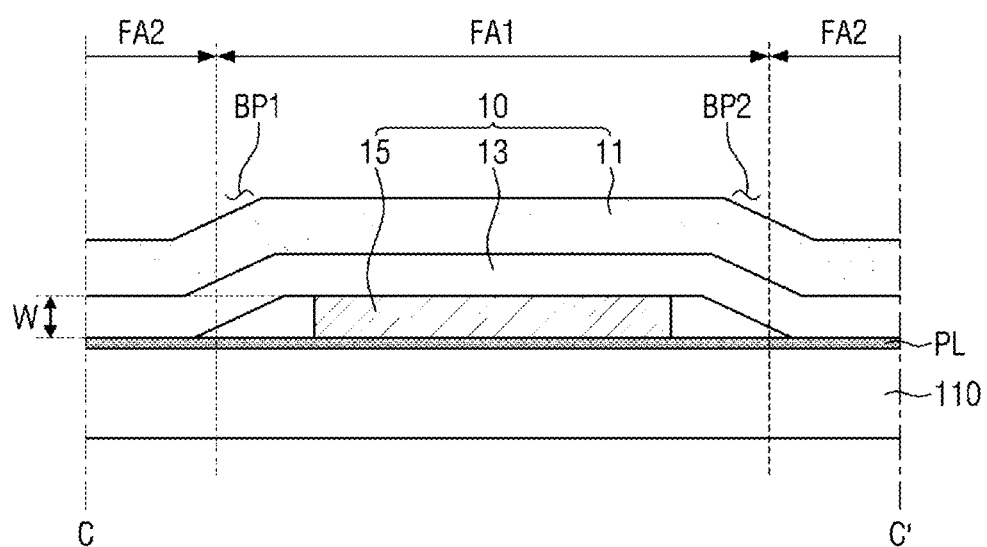
FIG. 8 is a cross-sectional view taken along line C-C' of FIG. 7.
Figure 8:
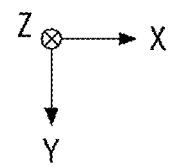

The first hole H1 and the second hole H2 may be arranged in an area corresponding to a camera. The sensor hole SH may be disposed to correspond to a sensor member such as an iris recognition sensor, an ultrasonic sensor, an illuminance sensor, or an infrared sensor, and the speaker hole MH may be disposed to correspond to a predetermined speaker. The first hole H1, the second hole H2, and the sensor hole SH may be optical holes defined by a print layer PL disposed on the base layer 110 of the cover window 100 as shown in FIG. 8. The print layer PL may be disposed in a part of the lower surface of the cover window 100 to form the aforementioned light blocking area NDA. That is, the print layer PL may be disposed to surround the outer periphery of the light transmitting area DA of the cover window 100.

The cover window 100 in an exemplary embodiment may include a protective film 10 including a protective member 15 disposed to overlap the first hole H1 and the second hole H2. The protective film 10 may be disposed on at least one surface of the cover window 100 to perform a function of protecting the cover window 100. The protective film 10 may be disposed to cover at least a part of the light transmitting area DA and light blocking area NDA of the cover window 100. The area overlapping the light blocking area NDA of the protective film 10 may be provided by recessing both sides inward from the area overlapping the light transmitting area DA. However, the invention is not limited thereto. In some cases, the protective film 10 may be configured such that the light blocking area NDA in which the plurality of holes H is defined and the light transmitting area may be separated as separate members, respectively.

The protective film 10 may include a first protective member 11, a second protective member 15 (shown in FIG. 3) disposed to overlap the first hole H1 and second hole H2 overlapping the front camera, and an adhesive layer disposed between the first protective member 11 and the second protective member 15. Details of the protective film 10 disposed on one surface of the cover window 100 will be described with reference to other drawings.

Figure 3:
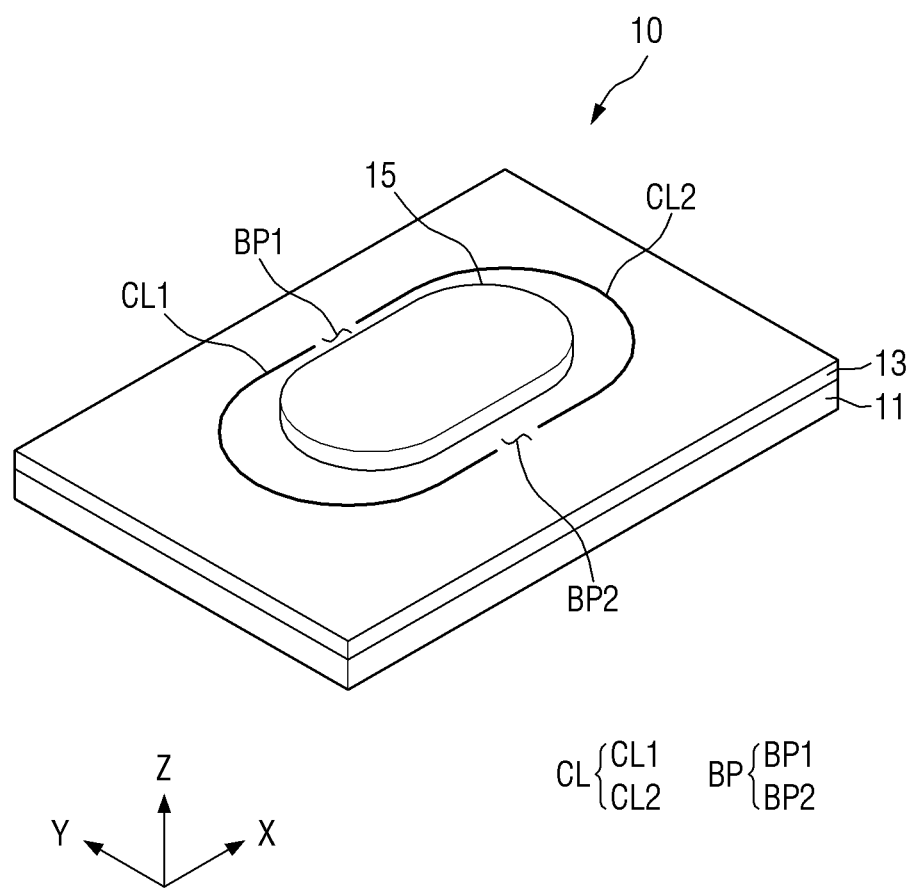
FIG. 3 is a perspective view of an exemplary embodiment of a protective film.
Figure 4:
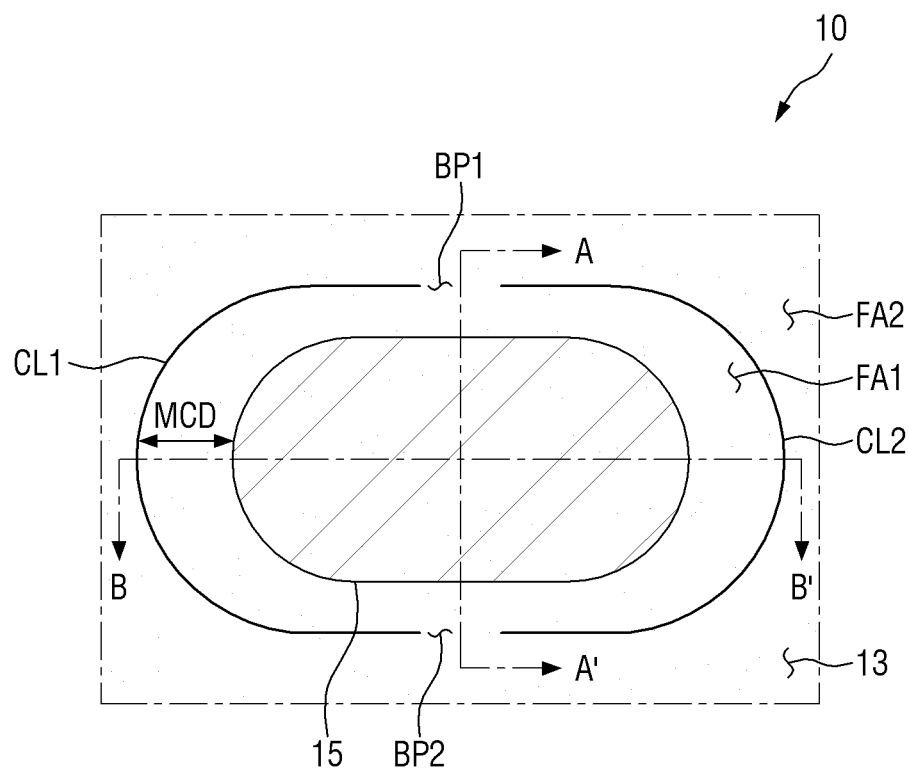
FIG. 4 is a plan view of the protective film of FIG. 3.
Figure 5:
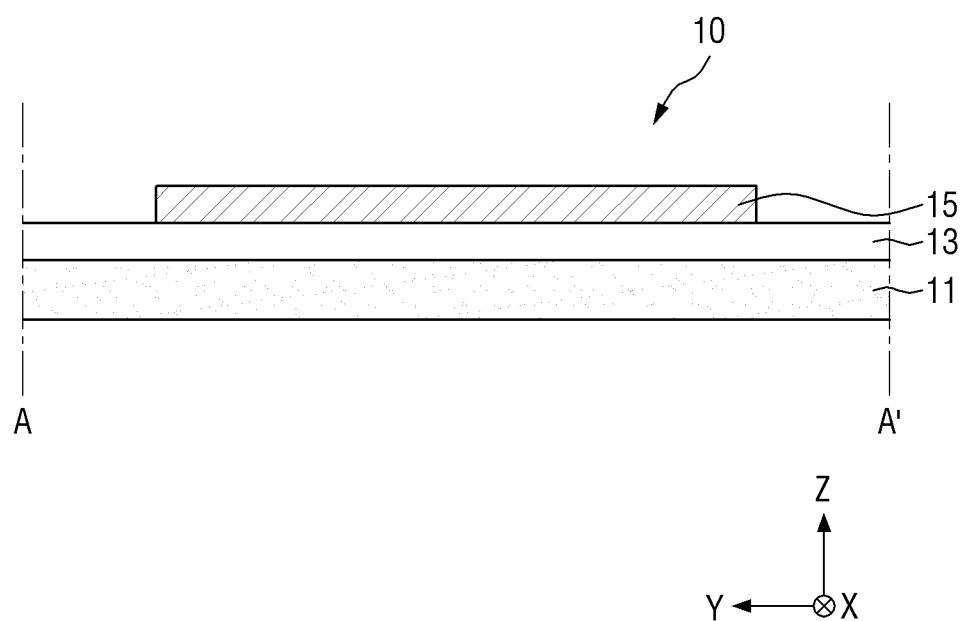
FIG. 5 is a cross-sectional view taken along line A-A' of FIG. 4.
Figure 6:
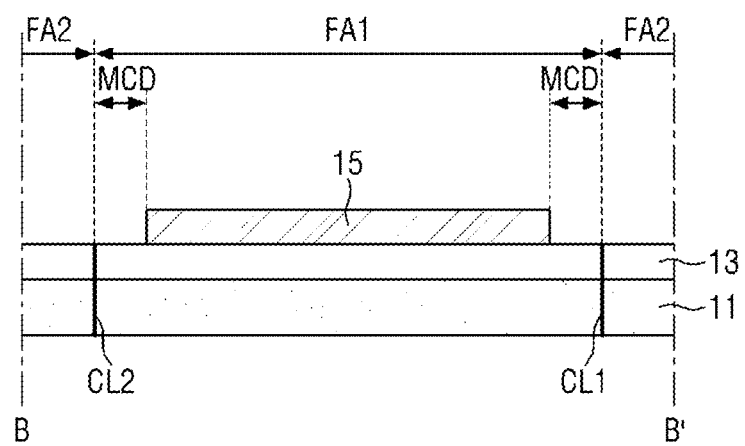
FIG. 6 is a cross-sectional view taken along line B-B' of FIG. 4.

FIG. 3 is a perspective view of an exemplary embodiment of a protective film, FIG. 4 is a plan view of the protective film of FIG. 3, FIG. 5 is a cross-sectional view taken along line A-A' of FIG. 4, and FIG. 6 is a cross-sectional view taken along line B-B' of FIG. 4. FIG. 4 is a plan view of the protective film 10 of FIG. 3 as seen from above, showing an area where the second protective member 15 is disposed.

Referring to FIGS. 3 to 6, the protective film 10 in an exemplary embodiment may include a first protective member 11, an adhesive layer 13, and a second protective member 15.

The first protective member 11 may be entirely provided to have substantially the same shape as the protective film 10. The first protective member 11 may be a base layer forming one surface of the protective film 10. In an exemplary embodiment, the first protective member 11 may include a polyethylene terephthalate resin, a polyester resin, a polystyrene resin, an acrylic resin, a polycarbonate resin, a cycloolefin polymer, or the like, for example, but the material of the first protective member 11 is not limited thereto. The first protective member 11 may be disposed on the lower surface of the cover window 100 to perform a function of protecting the light transmitting area DA and light blocking area NDA of the cover window 100.

The adhesive layer 13 is disposed on the first protective member 11. The adhesive layer 13 may be disposed on the entire surface of the first protective member 11 to attach the first protective member 11 to the second protective member 15 to be described later. The adhesive layer 13 may be in contact with one surface of the cover window 100 to attach the protective film 10 onto the cover window 100. In an exemplary embodiment, the adhesive layer 13 may include a urethane-based material or a silicon-based material, for example, but the material of the adhesive layer 13 is not limited thereto.

The second protective member 15 may be disposed on a part of the adhesive layer 13. The planar area of the second protective member 15 may be smaller than that of the adhesive layer 13 or the first protective member 11. The second protective member 15 and the first protective member 11 are attached and fixed to each other by the adhesive layer 13. The second protective member 15 may include a polycarbonate-based resin, for example, but the material thereof is not limited thereto. In an exemplary embodiment, the second protective member 15 may be disposed to overlap the first hole H1 and second hole H2 of the cover window 100. The second protective member 15 may disposed to cover the first hole H1 and the second hole H2, thereby preventing the damage and contamination of the first hole H1 and the second hole H2 in the transportation process of the cover window 100 or the assembling process using the transportation process.

The second protective member 15 may be provided to have a size capable of entirely covering the first hole H1 and the second hole H2. However, the invention is not limited thereto. The second protective member 15 may be provided to partially cover the first hole H1 and the second hole H2, or may be provided to cover the print layer PL together with the first hole H1 and the second hole H2 for the purpose of stable fixing. Accordingly, although it is shown in the drawings that the second protective member 15 has a circular shape or has an elliptical shape to cover a part of the print layer PL together with the first hole H1 and second hole H2 spaced apart from each other, the invention is not limited thereto.

Figure 10:
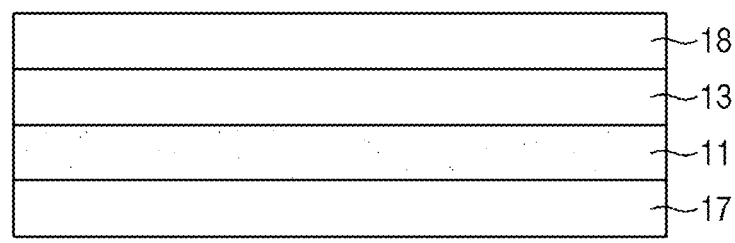
FIGS. 10 to 13 are cross-sectional views showing an exemplary embodiment of a process of manufacturing a protective film.

The second protective member 15 may be disposed by removing a part of a release paper (shown in FIG. 10) disposed on the adhesive layer 13 and performing a process of placing area A after removing the release paper. Here, the process of removing a part of the release paper may be performed by a process of cutting a part of the adhesive layer 13 together with the release paper. In this case, the adhesive layer 13 is partially cut, not entirely cut, thereby causing a problem that foreign matter of the adhesive layer 13, protruding along a cutting member, is generated. When the protruding foreign matter of the adhesive layer 13 is in contact with the cover window 100, appearance failure of the cover window 100 may occur.

The protective film 10 in an exemplary embodiment includes the cut line CL along which at least a part of the first protective member 11 and the adhesive layer 13 is cut, and thus the occurrence of the protruding foreign matter of the adhesive layer 13 may be minimized. Accordingly, the appearance failure of the cover window 100 including the protective film 10 may be prevented.

Specifically, the protective film 10 in an exemplary embodiment may include a first area FA1 in which the second protective member 15 is disposed, a second area FA2 which is an area other than the first area FA1, at least one cut line CL which is an area disposed between the first area FA1 and the second area FA2 and provided by cutting the adhesive layer 13, and at least one bridge portion BP which is an area disposed between the cut lines CL and in which the adhesive layer 13 is not cut.

The cut line CL of the protective film 10 may be a line along which at least the adhesive layer 13 is cut in a direction perpendicular to the first protective member 11. In an exemplary embodiment, the cut line CL may extend in the third direction (Z-axis direction) and extend to the upper surface of the adhesive layer 13 and the lower surface of the first protective member 11. That is, the adhesive layer 13 and the first protective member 11 may include an area in which the materials constituting the adhesive layer 13 and the first protective member 11 are discontinued by the cut line CL.

In an exemplary embodiment, the cut line CL may be spaced apart from the second protective member 15, and may be provided along at least a part of the outer surface of the second protective member 15. At least a part of the second protective member 15 may be spaced apart from the cut line CL and face the cut line CL. That is, the outer surface of the second protective member 15 and at least a part of the cut line CL may be provided in parallel to each other. The area where the outer surface of the second protective member 15 and the cut line CL face each other in parallel may extend in the first direction (X-axis direction) or may extend to be rounded to a predetermined curvature. In an exemplary embodiment, the interval MCD between the second protective member 15 and the cut line CL may be in a range of about 0.1 millimeter (mm) to about 0.3 mm, for example. Further, the interval MCD between the second protective member 15 and the cut line CL may be constant or partially different. However, the invention is not limited thereto.

As shown in the drawing, when the second protective member 15 has an elliptical shape, the cut line CL may have a rounded shape with a predetermined curvature. However, the invention is not limited thereto. The cut line CL may be provided by a process of removing the release paper placed on the adhesive layer 13 in the manufacturing process of the protective film 10. The release paper of the first area FA1 located inside the cut line CL may be removed, and the second protective member 15 may be disposed in the first area FA1.

In an exemplary embodiment, the cut line CL may include a plurality of cut lines CL spaced apart from each other, and the bridge portion BP may be disposed in the area between the cut lines CL spaced apart from each other. In an exemplary embodiment, the cut line CL may include a first cut line CL1 and a second cut line CL2, and the first cut line CL1 and the second cut line CL2 may be spaced apart from each other, for example. The bridge portion BP may include a first bridge portion BP1 located at an area where one end of the first cut line CL1 is spaced apart from one end of the second cut line CL2 and a second bridge portion BP2 located at an area where the other end of the first cut line CL1 is spaced apart from the other end of the second cut line CL2. In an exemplary embodiment, the width of each of the first bridge portion BP1 and the second bridge portion BP2 may be in a range of about 2 mm to about 5 mm, for example. However, the invention is not limited thereto.

It is shown in the drawings that the first cut line CL1 and the second cut line CL2 are spaced apart from each other in the first direction (X-axis direction) which is a horizontal direction in the drawing, and thus the first bridge portion BP1 and the second bridge portion BP2 are spaced apart from each other in the second direction (Y-axis direction). The respective ends of the first cut line CL1 and the second cut line CL2, which are spaced apart from each other, may be placed on the same line extending in the first direction (X-axis direction).

However, the invention is not limited thereto. The cut lines CL may be spaced apart from each other in a direction other than the first direction (X-axis direction), and the bridge portions BP may be spaced apart from each other in the first direction (X-axis direction) or in a direction crossing the first direction (X-axis direction). That is, the cut lines CL may be spaced apart from each other in a direction other than the first direction (X-axis direction), or may be provided such that the spaced area has a curvature. The protective film 10 may include a larger number of cut lines CL and a larger number of bridge portions BP. The second protective member 15 is disposed in the first area FA1 provided by the cut line CL and the bridge portion BP, and thus the second protective member 15 is disposed between the first bridge portion BP1 and the second bridge portion BP2.

The protective film 10 may include at least one bridge portion BP provided by separating a part of the cut line CL, and thus it is possible to prevent the protective film 10 from being separated into a plurality of pieces. That is, the materials constituting the first protective member 11 and the adhesive layer 13 may include a cut line CL having a discontinuous area and a bridge portion BP having a continuous area. The cut line CL is provided to extend from the upper surface of the adhesive layer 13 to the lower surface of the adhesive layer 13, thereby preventing the formation of the protruding matter of the adhesive layer 13 after cutting the protective film 10.

In the protective film 10, a first area FA1 and a second area FA2 may be defined, and a cut line CL and a bridge portion BP may be disposed between the first area FA1 and the second area FA2. As described above, the cut line CL may be an area where the materials constituting the first protective member 11 and the adhesive layer 13 are discontinuous, and the bridge portion BP may be an area where the materials are continuous. The protective film 10 may be provided thereon with the cut line CL, a part thereof being cut along one direction, and the bridge portion BP, a part thereof not being cut along one direction.

The line A-A' in FIG. 4 is a line crossing the bridge portion BP of the protective film 10, and the line B-B' in FIG. 4 is a line crossing the cut line CL. That is, FIG. 5 shows an area where the bridge portion BP is included and the materials of the adhesive layer 13 and the first protective member 11 are continuous, and FIG. 6 shows an area where the cut line CL is included and the materials of the adhesive layer 13 and the first protective member 11 are discontinuous.

As shown in FIG. 5, the protective film 10 includes the bridge portion BP where the materials of the adhesive layer 13 and the first protective member 11 are continuous. The second protective member (e.g., film) 15 may be disposed to be spaced inward from the outer surface of the first protective member 11, and may be disposed between the first bridge portion BP1 and the second bridge portion BP2.

As shown in FIG. 6, the protective film 10 includes the cut line CL where the materials of the adhesive layer 13 and the first protective member 11 are discontinuous. In an exemplary embodiment, the second protective member 15 may be spaced apart from the first cut line CL1 and the second cut line CL2, and the interval MCD between the second protective member and the first cut line CL1 or between the second protective member and the second cut line CL2 may be in a range of about 0.1 mm to about 0.3 mm, for example. In the process of placing the second protective member 15 on the adhesive layer 13, the adhesive layer 13 is completely cut along the cut line CL, thereby minimizing the foreign matter generated by protruding a part of the adhesive layer 13. Therefore, even when the protective film 10 is disposed one surface of the cover window 100, foreign matter is not generated by the adhesive layer 13, and thus appearance failure may be prevented.

Hereinafter, a structure of the protective film 10 disposed on one surface of the cover window 100 will be described.

Figure 7:
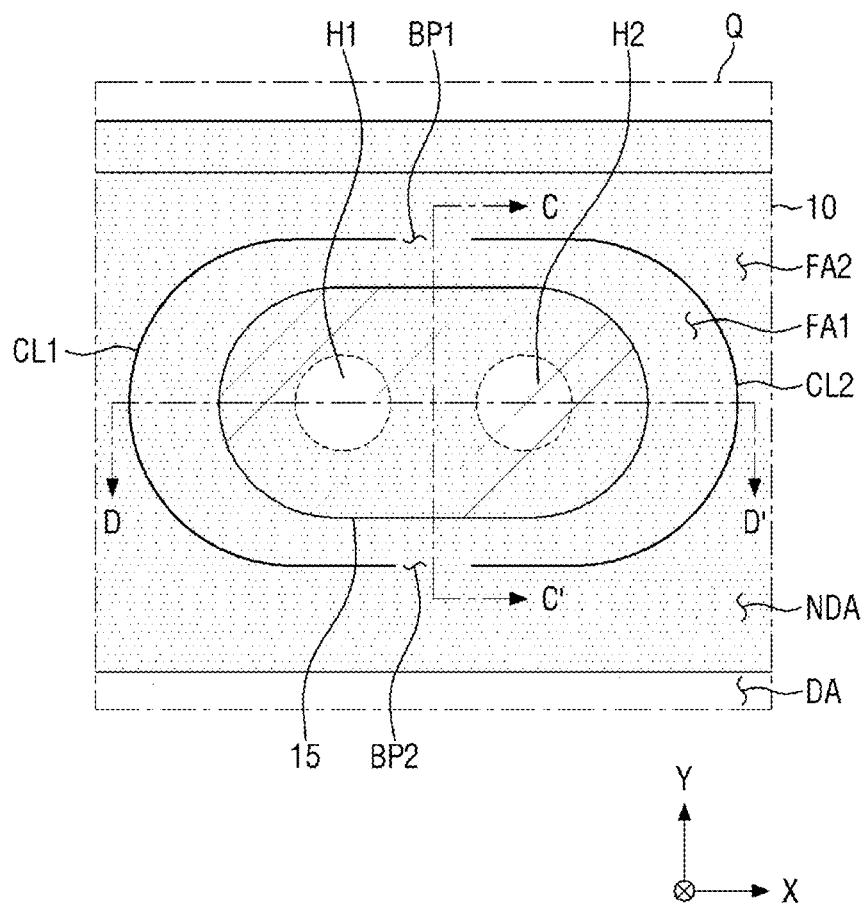
FIG. 7 is an enlarged view of the portion Q in FIG. 2.
Figure 9:
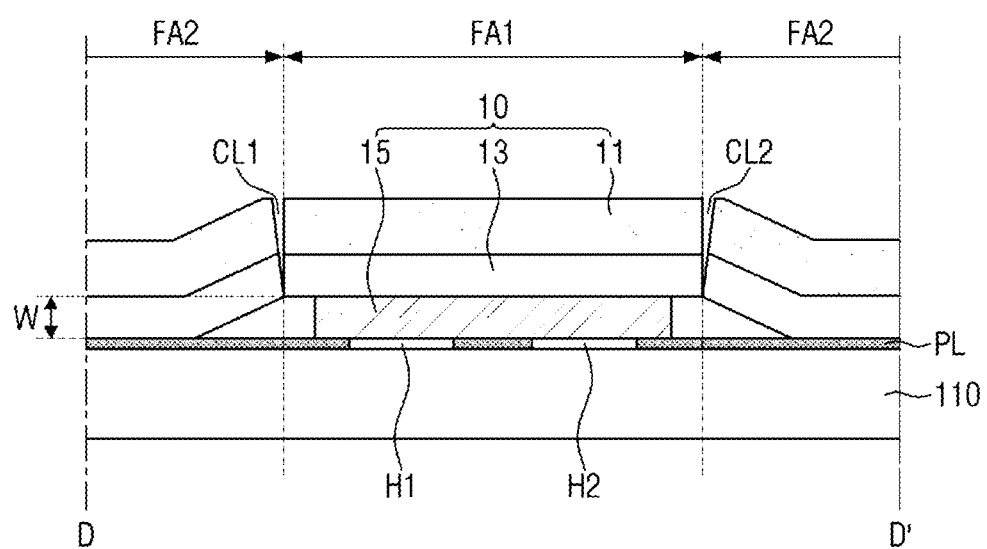
FIG. 9 is a cross-sectional view taken along line D-D' of FIG. 7.

FIG. 7 is an enlarged view of the portion Q in FIG. 2, FIG. 8 is a cross-sectional view taken along line C-C' of FIG. 7, and FIG. 9 is a cross-sectional view taken along line D-D' of FIG. 7.

FIG. 7 is a plan view of an area where the first hole H1 and second hole H2 of the cover window 100 are located, which is seen from below. FIG. 8 is a cross-sectional view of the protective film 10 across the first bridge portion BP1 and the second bridge portion BP2, and FIG. 9 is a cross-sectional view of the protective film 10 across the first cut line CL1 and the second cut line CL2. FIGS. 7 to 9 may be understood to show that the protective film 10 of FIG. 3 is disposed on one surface of the cover window 100.

Referring to FIGS. 7 to 9, the cover window 100 in an exemplary embodiment may include a base layer 110, a print layer PL, and a protective film 10. The light blocking area NDA of the cover window 100 is an area in which the print layer PL is disposed, and the plurality of holes H may be opening areas defined by the print layer PL. The print layer PL may be a black matrix layer that functions to cover electrode wirings of the display member 300 and the like.

The base layer 110 may be a substrate constituting the base frame of the cover window 100. The base layer 110 may include the aforementioned material constituting the cover window 100. In an exemplary embodiment, the base layer may include glass, sapphire, plastic, or the like, for example.

The print layer PL may be disposed on one surface of the base layer 110, for example, on the lower surface of the cover window 100. The print layer PL may have at least one layer, and each layer may have a different color, but the invention is not limited thereto.

The first hole H1 and the second hole H2 may be defined in the light blocking area NDA of the cover window 100, and may be spaced apart from each other. The first hole H1 and the second hole H2 may be an opening area in which the print layer PL is not disposed on the base layer 110. The first hole H1 and the second hole H2 may be defined to overlap a predetermined sensor or a camera.

The protective film 10 may be disposed on the base layer 110, and at least a part of the protective film 10 may be disposed on the print layer PL. The protective film 10 may be disposed entirely on the base layer 110, and thus the protective film 10 may be disposed in the light blocking area NDA in which the print layer PL is disposed, and the light transmitting area DA. However, the invention is not limited thereto. In some cases, the protective film 10 may be disposed only in the light blocking area NDA in which the print layer PL is disposed, and another separate protective may be disposed in the light transmitting area DA.

In the protective film 10, the second protective member 15 and at least a part of the adhesive layer 13 may be in contact with one surface of the base layer 110. The adhesive layer 13 is in contact with one surface of the base layer 110, and thus the protective film 10 may be attached and fixed to the base layer 110. The second protective member 15 is disposed between the adhesive layer 13 and the base layer 110 and has a predetermined thickness, and thus a step may be provided in the adhesive layer 13 and the first protective member 11.

The second protective member 15 may be disposed to overlap the first hole H1 and second hole H2 of the cover window 100, thereby preventing the damage and contamination of the first hole H1 and the second hole H2 in the transportation process or assembling process of the cover window 100. FIG. 8 shows a cross-section of the protective film 10 across the first bridge portion BP1 and the second bridge portion BP2, and shows that the second protective member 15 entirely overlaps the print layer PL. In contrast, FIG. 8 shows a cross-section of the protective film 10 across the first cut line CL1 and the second cut line CL2, and shows that a part of the second protective member 15 overlaps the print layer PL and another part thereof overlaps the first hole H1 and the second hole H2 which are opening areas. Accordingly, the protective film 10 and the base layer 110 may be fixed to each other. A part of the first protective member 11 and the adhesive layer 13 is provided with a step by the second protective member 15 disposed on the base layer 110. The first protective member 11 and the adhesive layer 13 may form flat upper surfaces in the area where the adhesive layer 13 is in contact with the base layer 110 and the area where the second protective member 15 is disposed.

However, a step is provided between the flat upper surfaces by the second protective member 15, and the area where the step is provided may overlap an area where the cut line CL and the bridge portion BP are located.

In the area where the first cut line CL1 and the second cut line CL2 are located, the first protective member 11 and the adhesive layer 13 may be spaced from each other with respect to the cut line CL by the step. That is, the first area FA1 and second area FA2 of the protective film 10 may be spaced from each other with respect to the cut line CL. In contrast, in the area where the first bridge portion BP1 and the second bridge portion BP2 are located, the first area FA1 and second area FA2 of the protective film 10 may form continuous areas without being spaced apart from each other.

As shown in FIGS. 8 and 9, in the area where the first bridge portion BP1 and the second bridge portion BP2 are located, the first protective member 11 and the adhesive layer 13 may not be spaced apart from each other. That is, the protective film 10 may form a continuous cross-section without separating the first area FA1 and the second area FA2. In contrast, in the area where the first cut line CL1 and the second cut line CL2 are located, the first protective member 11 and the adhesive layer 13 may be partially spaced apart from each other. The protective film 10 may form a discontinuous cross-section by separating the first area FA1 and the second area FA2 with respect to the cut line CL.

The protective film 10 disposed on the base layer 110 may form a discontinuous cross-section in the area where the first cut line CL1 and the second cut line CL2 are located, and thus the protruding foreign matter of the adhesive layer 13 may not be provided. Accordingly, foreign matter that may occur between the adhesive layer 13 and the base layer 110 is not visually recognized, and thus the appearance failure of the cover window 100 may be prevented.

In an exemplary embodiment, the thickness of the second protective member may be in a range of about 0.05 mm to about 0.10 mm, for example. Since the protective film 10 includes the cut line CL, foreign matter that may be provided in the adhesive layer 13 is prevented, but, in some cases, fine foreign matter may be provided. However, when the thickness W of the second protective member 15 of the protective film 10 is greater than the thickness of the foreign matter, it is possible to prevent the foreign matter from being visually recognized from the appearance of the cover window 100. When the thickness W of the second protective member 15 is less than 0.05 mm, for example, there may be a problem that foreign matter that may occur in the cut line CL of the protective film 10 is visually recognized from the appearance of the cover window 100. In contrast, when the thickness W of the second protective member 15 is 0.10 mm or more, for example, the adhesion force between the adhesive layer 13 and the base layer 110 may not be sufficient due to the step provided by the second protective member 15.

Hereinafter, a method of manufacturing the protective film 10 will be described with reference to other drawings.

FIGS. 10 to 13 are cross-sectional views showing an exemplary embodiment of a process of manufacturing a protective film.

First, an auxiliary film layer in which a first release paper 17, a first protective member 11, an adhesive layer 13, and a second release paper 18 are sequentially laminated is prepared. The auxiliary film layer may include a first protective member 11 and an adhesive layer 13 disposed thereon, and may include a first release paper 17 disposed on the lower surface of the first protective member 11 and a second release paper 18 disposed on the upper surface of the adhesive layer 13. A part of the first release paper 17 and a part of the second release paper 18 may remain in the finally manufactured protective film 10. However, when the protective film 10 is disposed on one surface of the cover window 100, the first release paper 17 and the second release paper 18 are separated.

Figure 11:
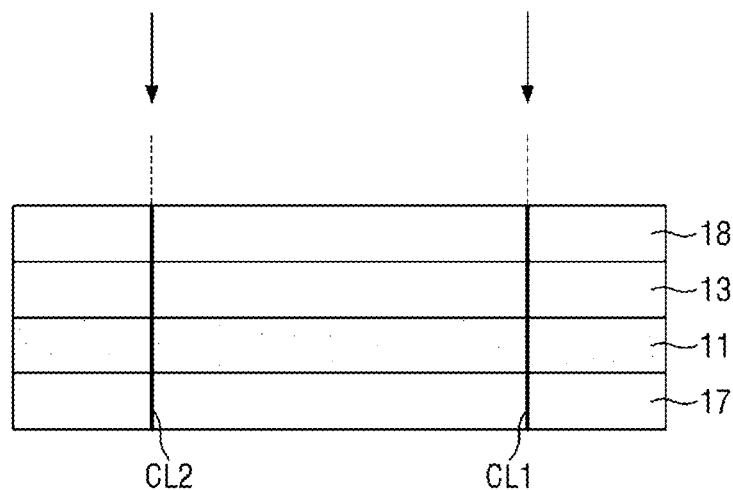

Next, referring to FIG. 11, the auxiliary film layer is cut in a direction perpendicular to the upper surface of the first protective member 11 to form a first cut line CL1 and a second cut line CL2. Although not shown in the drawing, the first cut line CL1 and the second cut line CL2 may be spaced apart from each other, and a first bridge portion BP1 and a second bridge portion BP2 may be disposed between the first cut line CL1 and the second cut line CL2. Since a detailed description of the cut line CL and the bridge portion BP is the same as that having been described above, hereinafter, a description thereof will be omitted.

Figure 12:
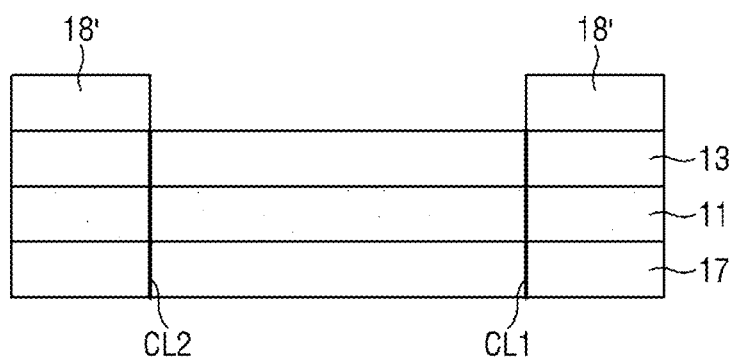

Next, referring to FIG. 12, a part of the second release paper 18 disposed between the first cut line CL1 and the second cut line CL2 is removed. A second protective member 15 is disposed in the area where the second release paper 18 was removed. Although not shown in the drawing, it may be under stood that the area where the second release paper 18 was removed refers to a first area FA1 and the area where a remaining second release paper 18' is disposed refers to a second area FA2. One end surface of the remaining second release paper 18' may form a plane parallel to the first cut line CL1 and the second cut line CL2. The second release paper 18' remaining on the adhesive layer 13 may remain on the protective film 10 to prevent the adhesive layer 13 of the protective film 10 from being contaminated in the transportation process of the protective film 10.

Figure 13:
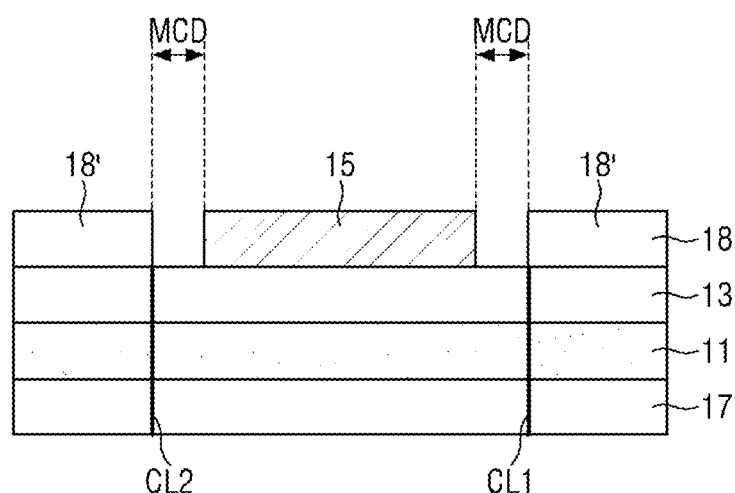

Next, referring to FIG. 13, a second protective member 15 is disposed in the area where the second release paper 18 was removed. The second protective member 15 may be disposed to be spaced apart from the remaining second release paper 18'. The area where the second protective member 15 is spaced apart from the remaining second release paper 18' may be understood to be the aforementioned interval MCD (shown in FIG. 4) between the second protective member 15 and the cut line CL.

In the process of placing the second protective member 15, a film including the material of the second protective member 15 is prepared, the film is partially cut to separate the second protective member 15, and then the separated second protective member 15 is placed on the adhesive layer 13. That is, the second protective member 15 may be provided by cutting the film according to the shape of the second protective member 15. The second protective member 15 cut in this way may be placed on the adhesive layer 13 to manufacture the protective film 10. However, the invention is not limited thereto.

Although not shown in the drawing, the protective film 10 may be manufactured such that at least one of the first release paper 17 and the remaining second release paper 18' is separated. Each of the first release paper 17 and the remaining second release paper 18' may function to protect the first protective member 11 and the adhesive layer 13 from an external environment, and may be removed when the protective film 10 is placed on one surface of the cover window 100.

Hereinafter, another exemplary embodiment of a protective film and a cover window will be described.

Figure 14:
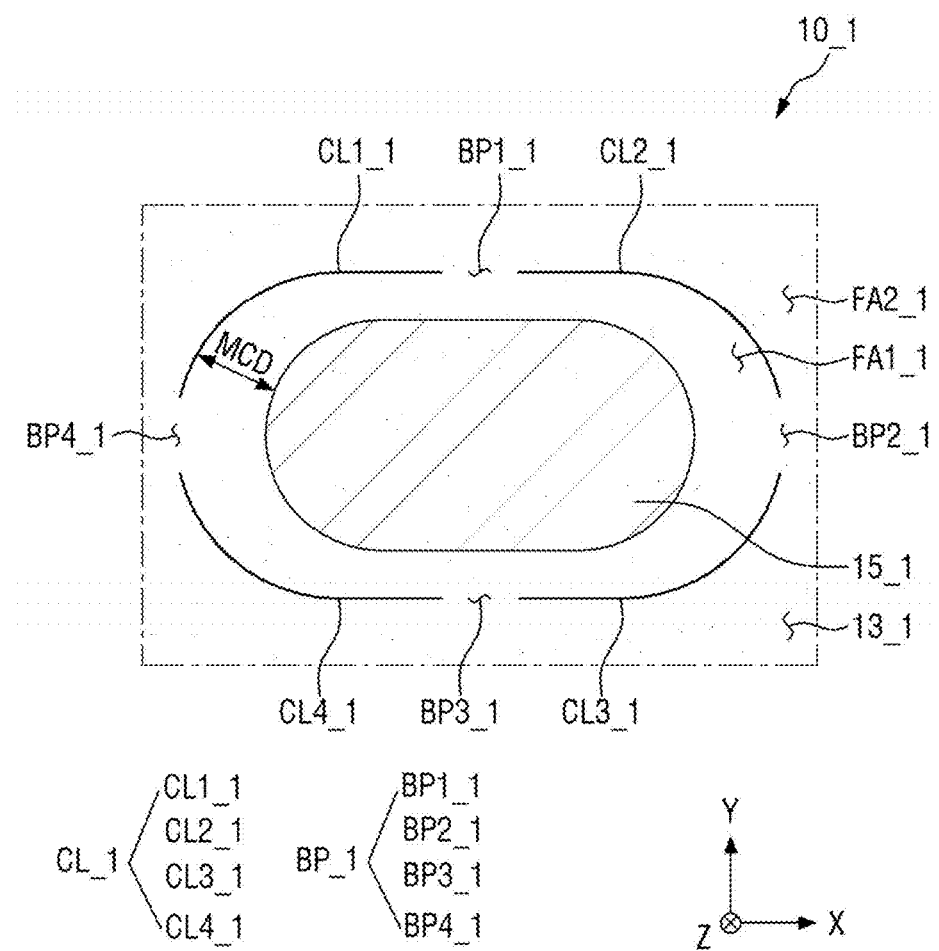
FIG. 14 is a plan view of another exemplary embodiment of a protective film.

FIG. 14 is a plan view of another exemplary embodiment of a protective film.

Referring to FIG. 14, a protective film 10_1 according to this exemplary embodiment may include a larger number of cut lines CL_1 and a larger number of bridge portions BP_1. The cut lines CL_1 may include a first cut line CL1_1, a second cut line CL2_1, a third cut line CL3_1, and a fourth cut line CL4_1. The bridge portions BP_1 may include a first bridge portion BP1_1, a second bridge portion BP2_1, a third bridge portion BP3_1, and a fourth bridge portion BP4_1. The protective film 10_1 of FIG. 14 is the same as the protective film 10 of FIG. 4, except that the protective film 10_1 includes a larger number of cut lines CL_1 and a larger number of bridge portions BP_1. Hereinafter, a redundant description will be omitted, and differences will be mainly described.

The first cut line CL1_1, the second cut line CL2_1, the third cut line CL3_1, and the fourth cut line CL4_1 are disposed so as to be spaced apart from the outer surface of the second protective member 15_1 and face the outer surface of the second protective member 15_1. The cut lines CL_1 form a plane parallel to the second protective member 15_1, and any one of the cut lines CL_1 is disposed to be spaced apart from the other one of the cut lines CL_1. The respective ends where the first cut line CL1_1 and the second cut line CL2_1 face the third cut line CL3_1 and the fourth cut line CL4_1 may be placed on the same line extending in the first direction (X-axis direction). The respective ends where the second cut line CL2_1 and the third cut line CL3_1 face the fourth cut line CL4_1 and the first cut line CL1_1 may be placed on the same line extending in the second direction (Y-axis direction). The length between both ends of the cut line CL_1 of FIG. 14 may be shorter than the length between both ends of the cut line CL1 of FIG. 4. Accordingly, a larger number of bridge portions BP_1 may be disposed on the protective film 10_1.

Bridge portions BP_1 are disposed among the plurality of cut lines CL_1. A first bridge portion BP1_1 may be disposed between the first cut line CL1_1 and the second cut line CL2_1, a second bridge portion BP2_1 may be disposed between the second cut line CL2_1 and the third cut line CL3_1, a third bridge portion BP3_1 may be disposed between the third cut line CL3_1 and the fourth cut line CL4_1, and a fourth bridge portion BP4_1 may be disposed between the fourth cut line CL4_1 and the first cut line CL1_1. The first bridge portion BP1_1 and the third bridge portion BP3_1 may be spaced apart from each other in the second direction (Y-axis direction) with respect to the second protective member 15_1, and the second bridge portion BP2_1 and the fourth bridge portion BP4_1 may be spaced apart from each other in the first direction (X-axis direction) with respect to the second protective member 15_1. The protective film 10_1 of FIG. 14 includes more bridge portions BP_1 than the protective film 10 of FIG. 4, and thus it is possible to prevent the first area FA1_1 from being separated from the protective film 10_1.

When the ratio of the area occupied by the cut line CL_1 to the area of the bridge portion BP_1 provided on the protective film 10_1 is too large, the first area FA1_1 may be separated from the second area FA2_1. When the bridge part BP_1 between the first area FA1_1 and the second area FA2_1 is damaged or broken, the first area FA1_1 and the second area FA2_1 may be separated from each other in the process of transporting the protective film 10_1 and attaching the protective film 10_1 to the cover window 100. In this case, it may be difficult to place the second protective member 15_1 in the area where the first hole H1 and second hole H2 of the cover window 100 are located. In particular, when the release papers 17 and 18 are removed from the manufactured protective film 10_1 including the release papers 17 and 18, the first area FA1_1 may also be removed at the same time. In order to prevent this difficulty, the protective film 10_1 according to this exemplary embodiment may include a larger number of bridge portions BP_1 and a larger number of cut lines CL_1.

In the protective film 10_1 of FIG. 14, the cut lines CL_1 may be spaced apart from each other in the first direction (X-axis direction) and the second direction (Y-axis direction), and thus the bridge portions BP_1 may be arranged in the first direction (X-axis direction) and the second direction (Y-axis direction) with respect to the second protective member 15_1. However, the positions of the bridge portions BP_1 are not limited to this, and the positions where the cut lines CL_1 are spaced apart from each other may be various.

Figure 15:
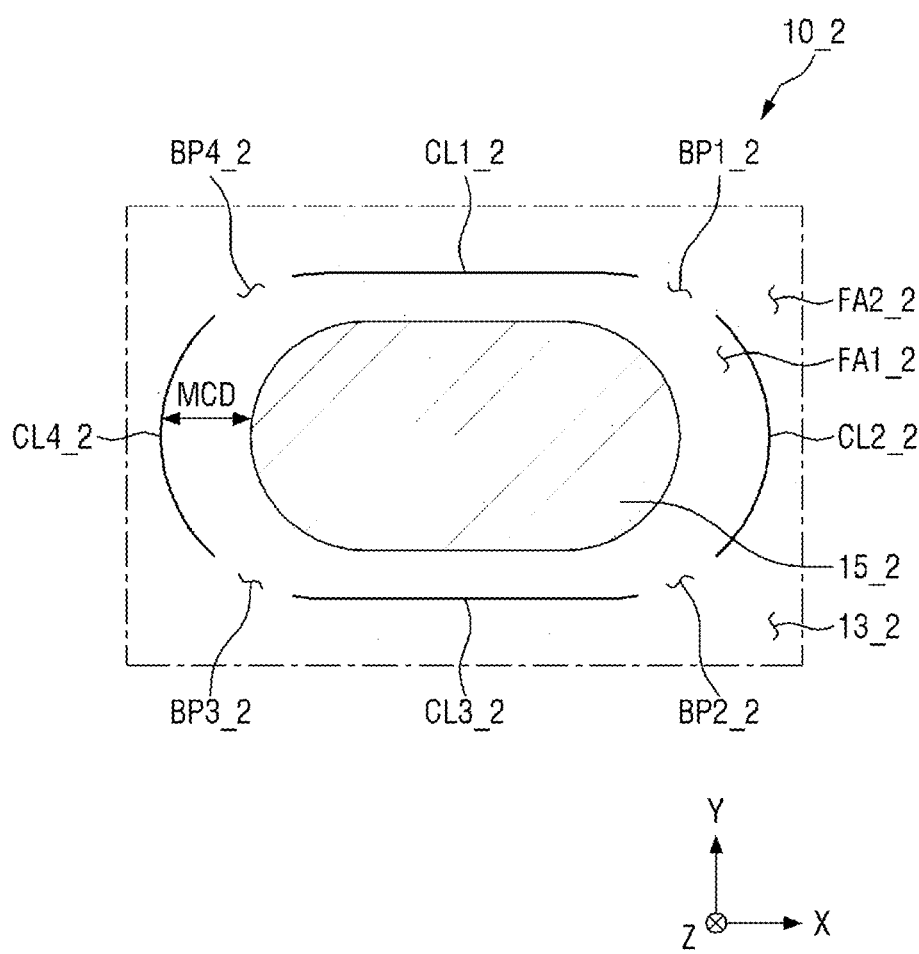
FIG. 15 is a plan view of another exemplary embodiment of a protective film.

FIG. 15 is a plan view of a protective film according to still another exemplary embodiment.

Referring to FIG. 15, in a protective film 10_2 according to this exemplary embodiment, the respective ends where a plurality of cut lines CL_2 are spaced apart from each other may not be placed on the same line extending in one direction. That is, the cut lines CL_2 extending in parallel to the outer surface of a second protective member 15_2 are spaced apart from each other in the curved area of the second protective member 15_2, and thus some of the cut lines CL_2 may have a shape extending in one direction, and others of the cut lines CL_2 may have a rounded shape with a predetermined curvature.

Specifically, a first cut line CL1_2 and a third cut line CL3_2 are provided to extend in the first direction (X-axis direction), and a second cut line CL2_2 and a fourth cut line CL4_2 are provided to extend roundly. The respective ends spaced apart from each other and facing each other between the cut lines CL_2 may be placed on the same line extending with a curvature. The protective film 10_2 of FIG. 15 is the same as the protective film 10_1 of FIG. 14, except that some of the cut lines CL_2 extend in the first direction (X-axis direction), and others of the cut lines CL_2 extend roundly. Details thereof will be omitted.

The protective film 10 may further include a sub-cut line connecting both ends of the cut line CL.

Figure 16:
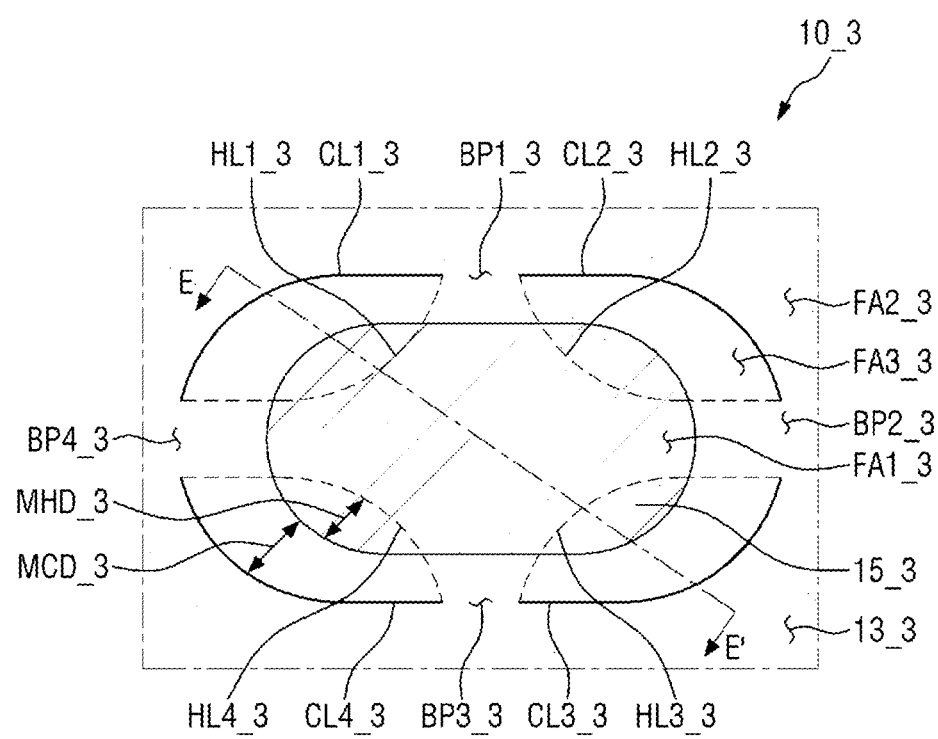
FIG. 16 is a plan view of another exemplary embodiment of a protective film.
Figure 17:
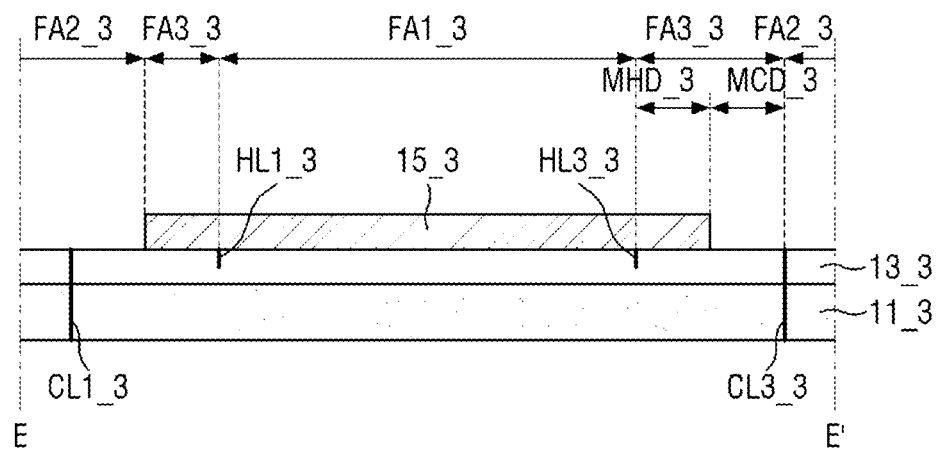
FIG. 17 is a cross-sectional view taken along line E-E' of FIG. 16.

FIG. 16 is a plan view of a protective film according to still another exemplary embodiment, and FIG. 17 is a cross-sectional view taken along line E-E' of FIG. 16. FIG. 17 shows a cross-section across the cut line CL_3 and sub-cut line HL_3 in FIG. 16.

Referring to FIGS. 16 and 17, a protective film 10_3 according to this exemplary embodiment may include a plurality of cut lines CL_3 and a sub-cut line HL_3 connecting both ends of the cut line CL_3. The protective film 10_3 of FIG. 16 is the same as the protective film 10_1 of FIG. 14, except that the protective film 10_3 further includes a sub-cut line HL_3. Hereinafter, differences will be mainly described.

In an exemplary embodiment, the sub-cut line HL_3 may extend in the vertical direction from the upper surface of an adhesive layer 13_3, and may be spaced apart from the lower surface of the adhesive layer 13_3 and may be terminated thereto. That is, unlike the cut line CL_3, The sub-cut line HL_3 may cut only at least a part of the adhesive layer 13_3. In the protective film 10_3 of FIG. 16, only the cut line CL_3 may be provided in a first protective member 11_3, and the cut line CL_3 and the sub-cut line HL_3 may be provided in an adhesive layer 13_3. The protective film 10_3 may include a first area FA1_3 which is an area between the center of the a second protective member 15_3 and the sub-cut line HL_3, a third area FA3_3 which is an area between the sub-cut line HL_3 and the cut line CL_3, and a second area FA2_3 which is an external area. A plurality of bridge portions BP_3 may connect the first area FA1_3 and the second area FA2_3, and may partially contact the third area FA3_3.

As shown in FIG. 17, the sub-cut line HL_3 may form a discontinuous area by a certain depth of the adhesive layer 13_3, and a continuous area may be disposed under the discontinuous area of the adhesive layer 13_3. The adhesive layer 13_3 may include a discontinuous area and a continuous area from the upper surface thereof to the lower surface thereof. That is, the sub-cut line HL_3 may be provided in the adhesive layer 13_3 by a predetermined depth, and the area where the sub-cut line HL_3 is provided may be the discontinuous area. The depth of the sub-cut line HL_3 is not particularly limited.

Both ends of one sub-cut line HL_3 may be in contact with both ends of the corresponding cut line CL_3, respectively. Both ends of the first sub-cut line HL1_3, the second sub-cut line HL2_3, the third sub-cut line HL3_3 and the fourth sub-cut line HL4_3 may be in contact with both ends of the first cut line CL1_3, the second cut line CL2_3, the third cut line CL3_3 and the fourth cut line CL4_3, respectively. The sub-cut line HL_3 may have a symmetrical structure with the cut line CL_3 with respect to an extension line connecting both ends of the cut line CL_3. However, the invention is not limited thereto, and the sub-cut line HL_3 may have a shape different from that of the cut line CL_3.

At least a part of the cut line CL_3 and the sub-cut line HL_3 may be spaced apart from the outer surface of the second protective member 15_3. The maximum value of the interval MCD_3 between the outer surface of the second protective member 15_3 and the cut line CL_3, which are spaced apart from each other, may be smaller than the interval MHD_3 between the outer surface of the second protective member 15_3 and the sub-cut line HL_3, which are spaced apart from each other. That is, the sub-cut line HL_3, as compared with the cut line CL_3, may be provided closer to the outer surface of the second protective member 15_3. However, the invention is not limited thereto, and the interval between the second protective member 15_3 and the cut line CL_3 may be substantially the same as the interval between the second protective member 15_3 and the sub-cut line HL_3.

In an exemplary embodiment, the sub-cut line HL_3 may partially overlap the second protective member 15_3. In the protective film 10_3 of FIG. 16, the cut line CL_3 and the sub-cut line HL_3 may be provided, and the second protective member 15_3 may be disposed in the area where the second release paper 18 was removed. Thus, at least a part of the second protective member 15_3 may be disposed on the sub-cut line HL_3. However, the invention is not limited thereto.

Figure 18:
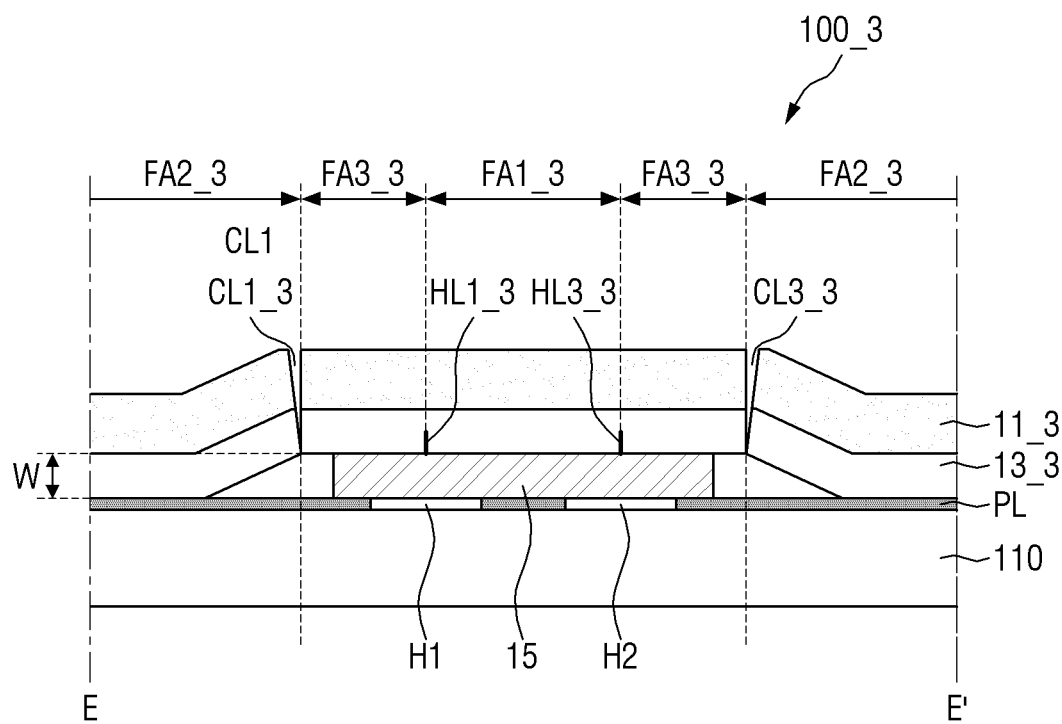
FIG. 18 is a partial cross-sectional view of a cover window to which the protective film of FIG. 16 is attached.

FIG. 18 is a partial cross-sectional view of a cover window to which the protective film of FIG. 16 is attached.

Referring to FIG. 18, a cover window 100_3 including the protective film 10_3 of FIG. 16 may include a base layer 110, a print layer PL, and a protective film 10_3. The protective film 10_3 may include a plurality of cut lines CL_3 cutting the adhesive layer 13_3 and a part of the first protective member 11_3, and a sub-cut line HL_3 cutting a part of the adhesive layer 13_3. The cover window 100_3 of FIG. 18 is substantially the same as the cover window 100 of FIG. 9, except that the adhesive layer 13_3 is provided with the sub-cut line HL_3. Details thereof will be omitted.

Figure 19:
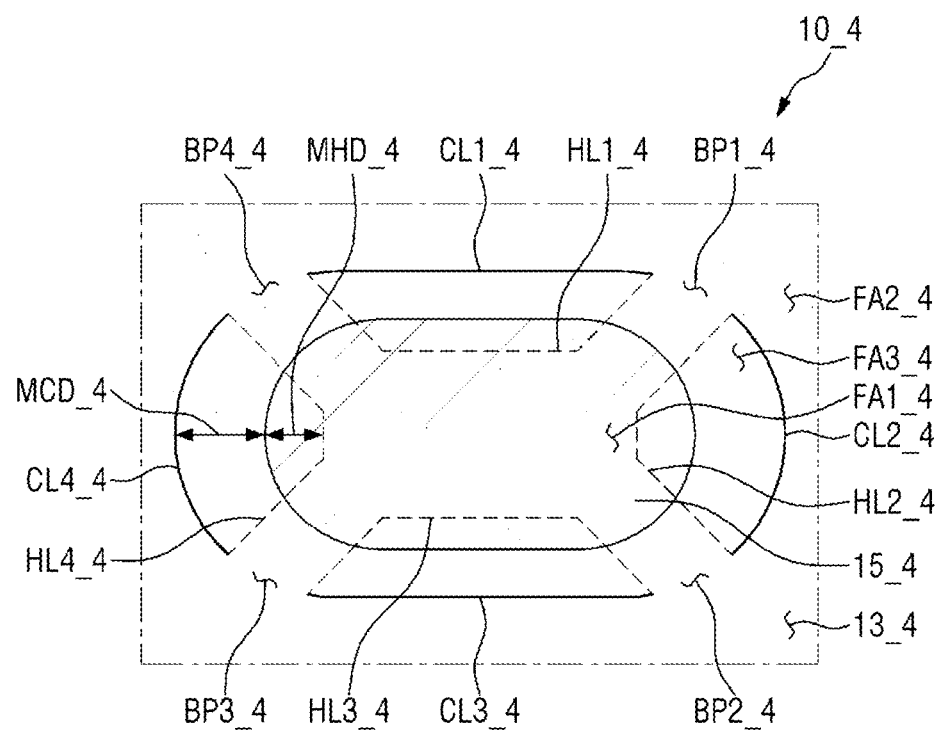
FIG. 19 is a plan view of another exemplary embodiment of a protective film.

FIG. 19 is a plan view of a protective film according to still another exemplary embodiment.

Referring to FIG. 19, a protective film 10_4 according to this exemplary embodiment may include a facing portion in which a sub-cut line HL_4 faces a cut line CL_4, and a plurality of connection portions connecting the facing portion to both ends of the sub-cut line HL_4. Accordingly, a bridge portion BP_4 may be disposed between the cut line CL_4 and the sub-cut line HL_4, and the bridge portion BP_4 may be in contact with a third area FA3_4 through the connecting portion. Unlike the sub-cut line HL_3 of FIG. 18, the sub-cut line HL_4 of FIG. 19 may have a shape in which the facing portion and the connection portion extend in one direction. The structure of the sub-cut line HL_4 may vary depending on the direction in which the second release paper 18 is cut in the manufacturing process of the protective film 10_4. The protective film 10_4 of FIG. 19 is the same as the protective film 10_3 of FIG. 16, except that the sub-cut line HL_4 includes the facing portions and the connection portions. Details thereof will be omitted.

The shapes of the first hole H1 and second hole H2 defined in the cover window 100 are not limited to the shapes shown in FIGS. 1 and 2. Further, in some cases, the cover window may have a shape in which a part of the light blocking area NDA is recessed, and the light transmitting area DA may be disposed in the recessed area. Hereinafter, another exemplary embodiment of a cover window will be described.

Figure 20:
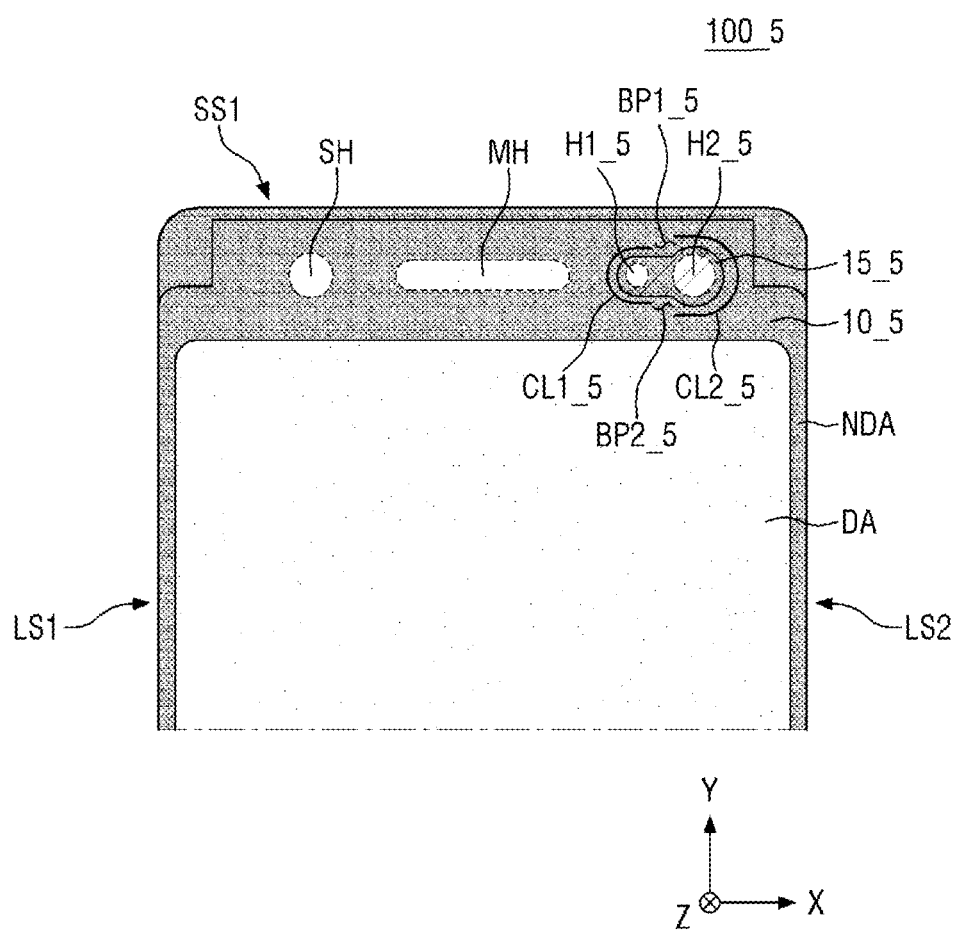
FIGS. 20 to 22 are partial plan views of other exemplary embodiments of cover windows.
Figure 21:
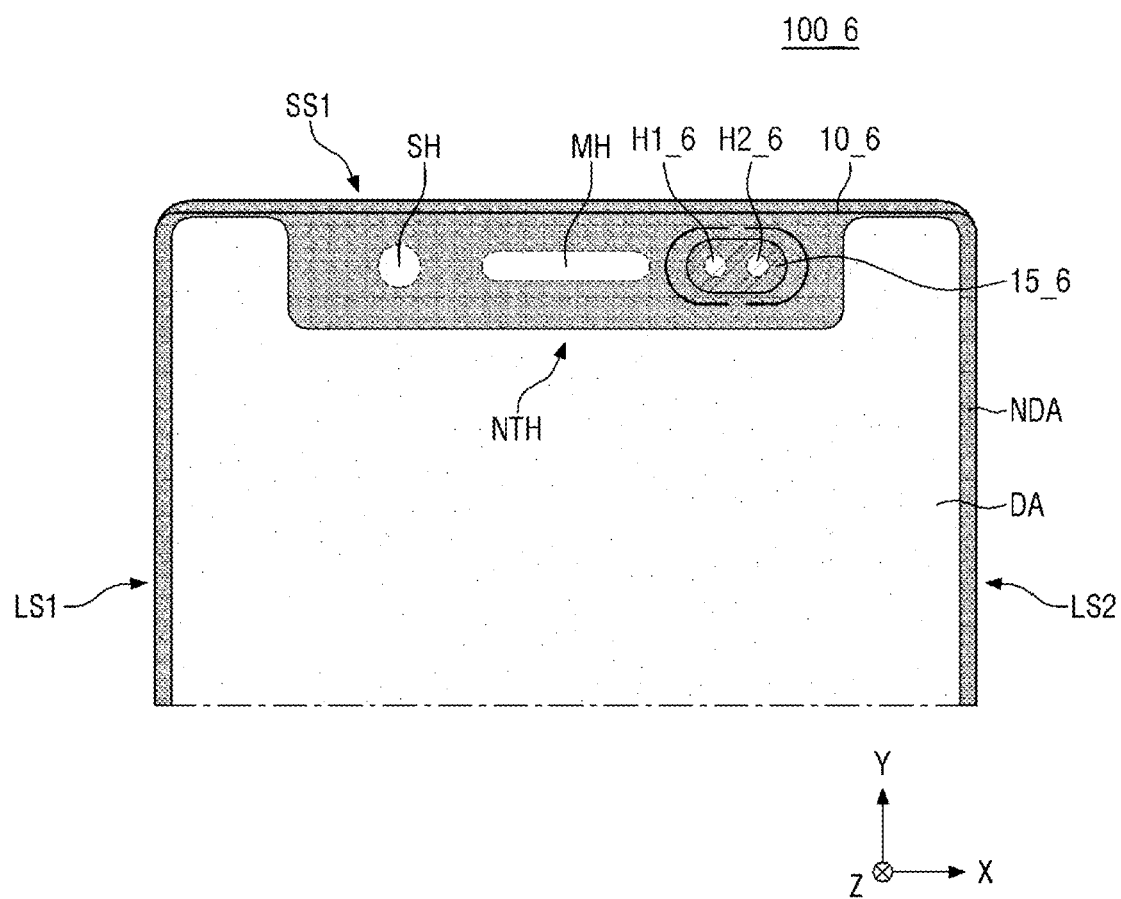
Figure 22:
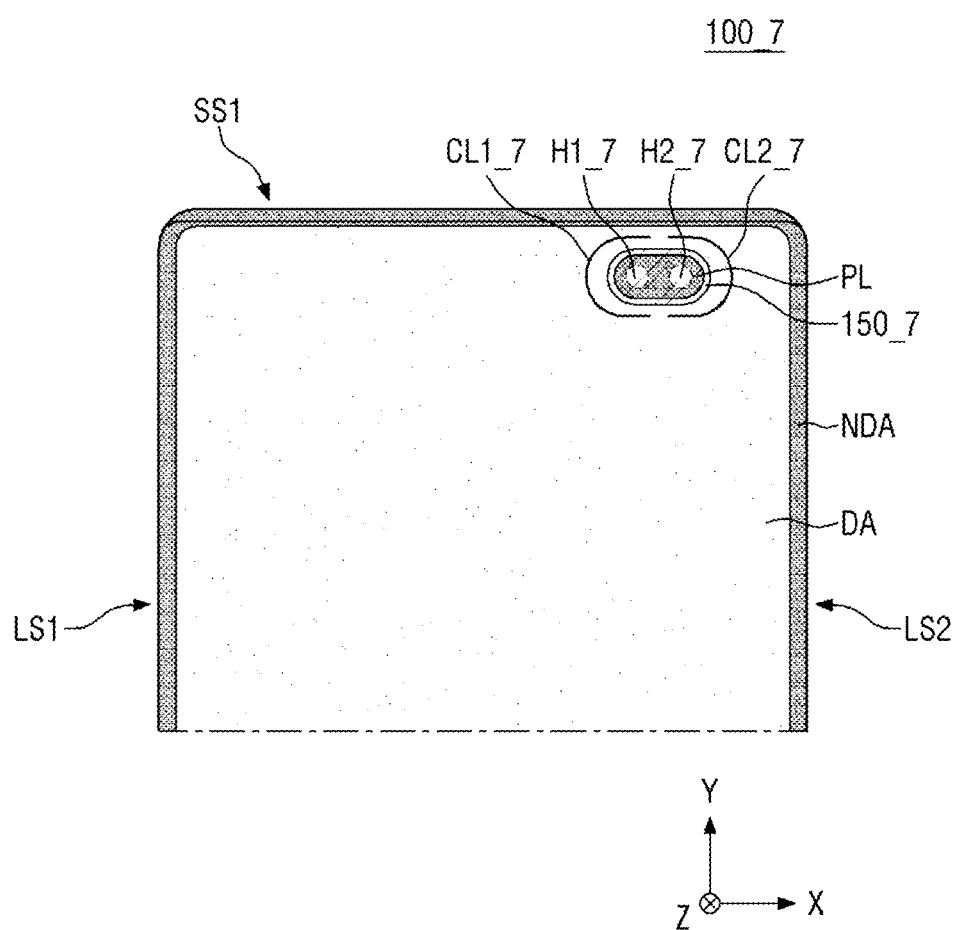

FIGS. 20 to 22 are partial plan views of cover windows according to other exemplary embodiments.

Referring to FIG. 20, in a cover window 100_5 according to this exemplary embodiment, the diameter of a first hole H1_5 may be different from the diameter of a second hole H2_5. Accordingly, a protective film 10_5 disposed in the cover window 100_5 of FIG. 20 may include an area where a part of a second protective member 15_5 is extended with a different width. The cover window 100_5 of FIG. 20 is substantially the same as the cover window 100 of FIG. 2 except that the diameter of the first hole H1_5 is different from the diameter of the second hole H2_5, and the shape of the second protective member 15_5 is different. Hereinafter, a redundant description will be omitted, and differences will be mainly described.

The cover window 100_5 of FIG. 20 may include the second hole H2_5 having a larger diameter than the that of first hole H1_5, and the second protective member 15_5 disposed to overlap the first hole H1_5 and the second hole H2_5 may include an area extended such that the area overlapping the second hole H2_5 has a larger area. In an exemplary embodiment, the area overlapping the second hole H2_5 of the second protective member 15_5 may have a circular shape having a larger diameter than that of the area overlapping the first hole H1_5 of the second protective member 15_5. Further, the cut lines CL_5 provided to be spaced apart from the outer surface of the second protective member 15_5 may include a first cut line CL1_5 having a relatively small diameter and a second cut line CL2_5 having a relatively large diameter. The first cut line CL1_5 may be adjacent to and spaced apart from an area of the second protective member 15_5 overlapping the first hole H1_5, and the second cut line CL2_5 may be adjacent to and spaced apart from an area of the second protective member 15_5 overlapping the second hole H2_5. As described above, since the diameter of the first hole H1_5 is smaller than the diameter of the second hole H2_5, the interval between both ends of the first cut line CL1_5, which are spaced apart from each other, may be narrower than the interval between both ends of the second cut line CL2_5, which are spaced apart from each other.

In an exemplary embodiment, both ends of the first cut line CL1_5 may be spaced apart from both ends of the second cut line CL2_5, and may be placed on a different line. That is, the line on which both ends of the first cut line CL1_5 extend may be spaced apart from the line on which both ends of the second cut line CL2_5 extend. Both ends of the second cut line CL2_5 may be provided to be spaced apart from both ends of the first cut line CL1_5 with respect to the center of the second protective member 15_5. In the first bridge portion BP1_5 and second bridge portion BP2_5 between the respective cut lines CL_5, the width of the area contacting both ends of the first cut line CL1_5 may be narrower than the width of the area contacting both ends of the second cut line CL2_5. However, the invention is not limited thereto.

Referring to FIG. 21, a cover window 100_6 according to this exemplary embodiment may include a notch portion having a shape in which a part of the light blocking area is recessed. The cover window 100_6 of FIG. 21 is the same as the cover window 100 of FIG. 2, except that the cover window 100_6 includes a notch portion NTH disposed at one side of the cover window 100_6. Hereinafter, a redundant description will be omitted, and differences will be mainly described.

A notch portion NTH, which is concavely provided toward the inside of the light transmitting area DA in the form of a notch, may be disposed at the first short side SS1 of the cover window 100_6. The notch portion NTH may be provided with a print layer PL constituting the light blocking area NDA, and a plurality of holes may be provided in the notch portion NTH. The cover window 100_6 further includes the light transmitting area DA located at both sides of the notch portion NTH, and thus an image displayed toward the upper surface of the cover window 100_6 may be displayed on both sides of the notch NTH. That is, the front display area of the cover window 100_6 may be extended.

Referring to FIG. 22, in a cover window 100_7 according to this exemplary embodiment, the first hole H1_7 and second hole H2_7 of the plurality of holes H may be disposed in the light transmitting area DA, and the print layer PL surrounding the first hole H1_7 and second hole H2_7 may be disposed in the light transmitting area DA. In the cover window 100_7 of FIG. 22, the light blocking area NDA may be provided to have a narrow width, and the print layer PL in which the first hole H1_7 and the second hole H2_7 are defined may further be disposed in the light transmitting area DA. The cover window 100_7 of FIG. 22 is the same as the cover window of FIG. 2, except that the arrangement of the first hole H1_7, the second hole H2_7 and the print layer PL is different. Hereinafter, differences will be described.

The cover window 100_7 of FIG. 22 may include a print layer PL disposed on the underlying light transmitting area DA, and a first hole H1_7 and a second hole H2_7 in each of which a part of the print layer PL is opened may be defined in the print layer PL. The second protective member 15_7 of the protective film 10_7 disposed on the lower surface of the cover window 100_7 may be disposed to overlap the print layer PL, the first hole H1_7, and the second hole H2_7. A camera (not shown) included in the display device 1000 (refer to FIG. 24) may be disposed to overlap the first hole H1_7 and second hole H2_7 of the light transmitting area DA of the cover window 100_7.

When the camera of the display device 1000 is disposed to overlap the light transmitting area DA of the cover window 100_7, the area of the light blocking area NDA relatively decreases, and thus the area of the light transmitting area DA in which light emitted from the display member 300 or an image is displayed may increase. On the light transmitting area DA of the cover window 100_7, a print layer PL for forming the first hole H1_7 and second hole H2_7 in which cameras may be disposed, and a protective film 10_7 for protecting the first hole H1_7 and the second hole H2_7 may be disposed. In particular, the second protective member 15_7 of the protective film 10_7 may be disposed to partially overlap the print layer PL, the first hole H1_7, and the second hole H2_7. Since descriptions of the print layer PL, the first hole H1_7, the second hole H2_7, the second protective member 15_7 of the protective film 10_7, and the cut line CL_7 are the same as those having been described with reference to other drawings, details thereof will be omitted.

The cover window 100 may have a shape in which a part of the outer frame thereof is inclined or rounded.

Figure 23:
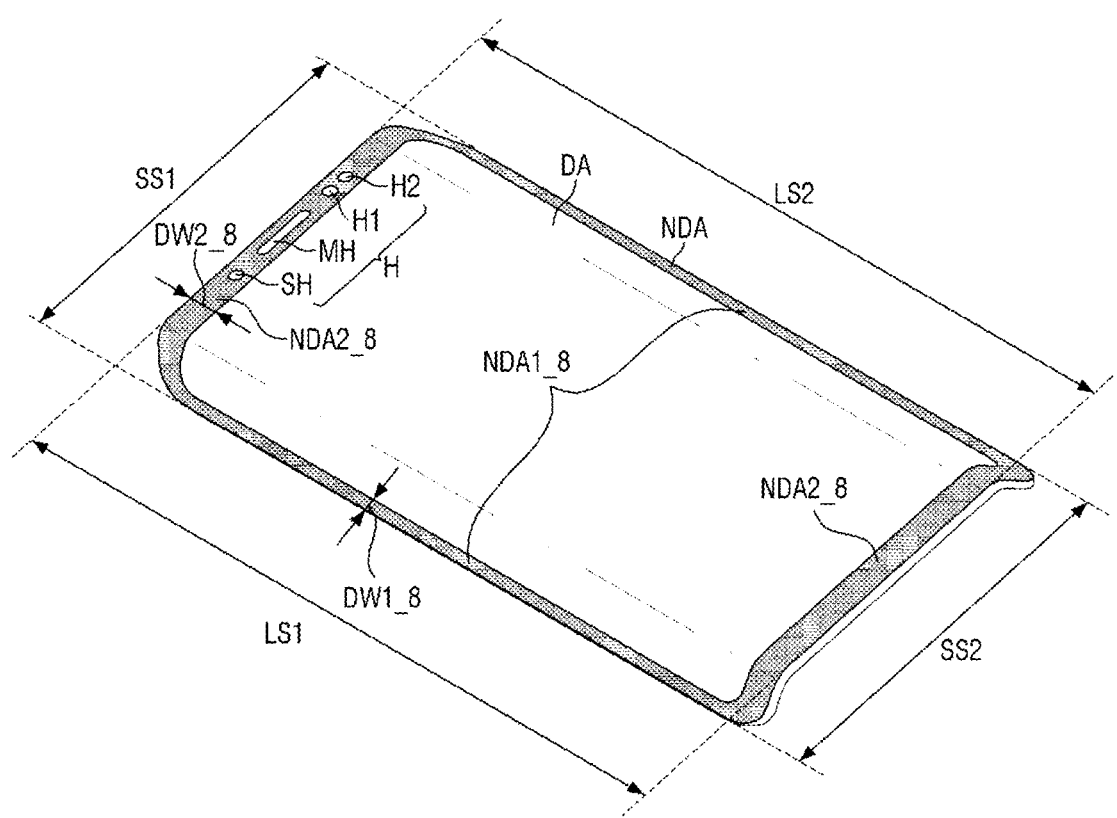
FIG. 23 is a perspective view of another exemplary embodiment of a cover window.

FIG. 23 is a perspective view of a cover window according to still another exemplary embodiment.

Referring to FIG. 23, a cover window 100_8 according to this exemplary embodiment may have a shape in which at least a part of the outer frame thereof provided with the light blocking area is inclined at a predetermined angle or is rounded. It is shown in FIG. 23 that the left and right side surfaces of the cover window 100_8 are bent in the third direction (Z-axis direction) or in a downward direction to be rounded with a predetermined curvature. However, the invention is not limited thereto, and the upper and lower side surfaces of the cover window 100_8 may be bent, or the corners thereof where edges meet each other may be partially bent.

The light blocking area NDA may be disposed along both long sides LS1 and LS2 of the cover window 100_8 and both short sides SS1 and SS2 of the cover window 100_8, and the light blocking area NDA may include a first light blocking area NDA1_8 located adjacent to both long sides LS1 and LS2 and a second light blocking area NDA2_8 located adjacent to both short sides SS1 and SS2.

The first light blocking area NDA1_8 may located at both sides of the cover window 100_8 in the first direction (X-axis direction), that is, at the left and right sides of the cover window 100_8, and the second light blocking area NDA2_8 may located at both sides of the cover window 100_8 in the second direction (Y-axis direction), that is, at the upper and lower sides of the cover window 100_8. In an exemplary embodiment, each of the first light blocking area NDA1_8 and the second light blocking area NDA2_8 may be provided to have a predetermined width, and the width DW2_8 of the second light blocking area NDA2_8 may be wider than the width DW1_8 of the first light blocking area NDA1_8, for example.

Since the first light blocking area NDA1_8 is provided to have a relatively narrow width DW1_8, the area of the light transmitting area DA of the cover window 100_8 increases, and thus a larger number of images may be simultaneously transmitted from the display device 1000 (refer to FIG. 24). Since the second light blocking area NDA2_8 is provided to have a relatively wide width DW2_8, a space in which other members included in the display device 1000, such as a speaker and a camera, may be secured or a logo or a pattern may be printed, and thus the esthetics of the display device 1000 may be improved. However, the invention is not limited thereto. In some cases, at least a part of the second light blocking area NDA2 is concavely provided to have a partially narrower width.

Further, in an exemplary embodiment, the first light blocking area NDA1_8 adjacent to both long sides LS1 and LS2 of the cover window 100_8 may be longer in one direction than the second light blocking area NDA2_8 adjacent to both short sides SS1 and SS2 of the cover window 100_8. As described above, the cover window 100_8 may include respective sides having different lengths, and the first light blocking areas NDA1_8 and second light blocking areas NDA2_8 located adjacent to these sides may have different lengths and extend in different directions.

Accordingly, when a user looks at the cover window 100_8 from the front, the light blocking area NDA of the left and right bent areas may be viewed with a relatively narrow width. Further, other members may be further disposed under the bent area of the cover window 100_8 to improve spatial utilization on the cover window 100_8. The cover window 100_8 of FIG. 23 is substantially the same as the cover window 100 of FIG. 1, except that a part of the light blocking area NDA of the outer frame is bent. Details thereof will be omitted.

FIG. 24 is an exploded perspective view of an exemplary embodiment of a display device including a cover window.

Referring to FIG. 24, an exemplary embodiment of a display device 1000 includes a cover window 100, a touch member 200, a display member 300, a middle frame 600, and a lower cover 900.

The cover window 100 may be disposed on one surface of the display member 300 in the third direction (Z-axis direction), for example, on the upper surface of the display member 300. The cover window 100 may cover the display member 300 and the like of the display device 1000 to protect the display member 300 and the like. In an exemplary embodiment, the cover window 100 may have substantially the same shape as the display member 300, and may have a larger size than the display member 300 so as to entirely cover one surface of the display member 300, for example. That is, each side of the cover window 100 may be provided to protrude from each side of the display member 300, but the invention is not limited thereto.

The cover window 100 may be any one of the aforementioned cover windows. The protective film 10 attached to the back surface of the cover window 100 may be removed in a process of assembling the cover window 100 with the touch member 200, the display member 300, the middle frame 600, and the lower cover 900. A detailed description of the cover window 100 will be omitted.

The touch member 200 may be disposed between the cover window 100 and the display member 300. The touch member 200 may be disposed corresponding to the light transmitting area DA of the cover window 100. However, the invention is not limited thereto, and the touch member 200 may be disposed on the light transmitting area DA and a part of the light blocking area NDA of the cover window 100. In this case, a touch may be detected even in the light blocking area NDA.

The touch member 200 may be attached to the lower surface of the cover window 100 through an adhesive member. A polarization film may be additionally provided on the touch member 200 in order to prevent a decrease in visibility due to external light reflection. In this case, the polarization film may be attached to the lower surface of the cover window 100 through the adhesive member.

The touch member 200, which is a device for sensing a touch position of a user, may be implemented by a capacitance type such as a self-capacitance type or a mutual capacitance type. When the touch member 200 is implemented by a self-capacitance type, the touch member 200 may include only touch driving electrodes. In contrast, when the touch member 200 is implemented by a mutual capacitance type, the touch member 200 may include touch driving electrodes and touch sensing electrodes. Hereinafter, a case where the touch member 200 is implemented by a mutual capacitance type will be mainly described.

The touch member 200 may be provided in the form of a panel or a film. In this case, the touch member 200 may be attached onto a thin film encapsulation film of the display member 300 through the adhesive member. In an exemplary embodiment, the adhesive member may be an optically clear adhesive ("OCA") film or an optically clear resin ("OCR") film, for example.

In an alternative exemplary embodiment, the touch member 200 may be unitary with the display member 300. In this case, the touch driving electrodes and touch sensing electrodes of the touch member 200 may be disposed on the thin film encapsulation film of the display member 300.

The display member 300 may be a member for displaying information or an image by an inputted data signal. Examples of the display member 300 may include, but are not limited to, an organic light emitting display panel, an inorganic light emitting display panel, a liquid crystal display panel, a plasma display panel, and an electrophoretic display panel.

The display member 300 may have a rectangular shape in a plan view. In an exemplary embodiment, the display member 300 may have a rectangular planar shape having short sides in the first direction (X-axis direction) and long sides in the second direction (Y-axis direction) as shown in the drawing, for example. The corner where the short side in the first direction (X-axis direction) meets the long side in the second direction (Y-axis direction) may be provided at a right angle or may be provided to be rounded with a predetermined curvature. However, the plane shape of the display member 300 is not limited to a rectangle, and the display member 300 may be provided in the shape of another polygon, a circle, or an ellipse. Although it is shown in the drawings that the display member 300 is provided to be flat, the invention is not limited thereto. At least one side of the display member 300 may be provided to be bent at a predetermined curvature.

The display member 300 may include a substrate, a thin film transistor ("TFT") layer disposed on the substrate, a light emitting element layer disposed on the TFT layer, and a thin film encapsulation layer disposed on the light emitting element layer.

Since the display member 300 is flexible, the display member 300 may include plastic. In this case, the substrate may include a flexible substrate and a support substrate. Since the support substrate is used to support a flexible substrate, the support substrate may have lower flexibility than the flexible substrate. Each of the flexible substrate and the support substrate may include a polymer material having flexibility. In an exemplary embodiment, each of the flexible substrate and the support substrate may include polyethersulphone ("PES"), polyacrylate ("PA"), polyarylate ("PAR"), polyetherimide ("PEI"), polyethylenenapthalate ("PEN"), polyethylene terepthalate ("PET"), polyphenylenesulfide ("PPS"), polyallylate, polyimide ("PI"), polycarbonate ("PC"), cellulosetriacetate ("CAT"), cellulose acetate propionate ("CAP"), or a combination thereof, for example.

The TFT layer is disposed on the substrate. The TFT layer may include scan lines, data lines, and TFTs. Each of the TFTs includes a gate electrode, a semiconductor layer, a source electrode, and a drain electrode. When a scan driver is disposed directly on the substrate, the scan driver may be disposed together with the TFT layer.

The light emitting element layer is disposed on the TFT layer. The light emitting element layer includes anode electrodes, a light emitting layer, a cathode electrode, and banks. The light emitting layer may include an organic light emitting layer including an organic material. In an exemplary embodiment, the light emitting layer may include a hole injection layer, a hole transporting layer, an organic light emitting layer, an electron transporting layer, and an electron injection layer, for example. The hole injection layer and the electron injection layer may be omitted. When a voltage is applied to the anode electrode and the cathode electrode, holes and electrons are moved to the organic light emitting layer through the hole transporting layer and the electron transporting layer, respectively, and are combined with each other to emit light. The light emitting element layer may be a pixel array layer in which pixels are disposed, and thus the area in which the light emitting element layer is disposed may be defined as a display area for displaying an image. The peripheral area of the display area may be defined as a non-display area.

The thin film encapsulation layer is disposed on the light emitting element layer. The thin film encapsulation layer serves to prevent oxygen or moisture from penetrating into the light emitting element layer. The thin film encapsulation layer may include at least one inorganic film and at least one organic film.

The middle frame 600 may be disposed under the display member 300. The middle frame 600 may include a bottom portion and a side portion bent from the end of the bottom portion. In an exemplary embodiment, the display member 300 and the camera may be accommodated in the bottom portion. The camera may be accommodated in the bottom portion of the middle frame 600 corresponding to the first hole H1 or second hole H2 of the cover window 100, and the display member 300 may be accommodated in the bottom portion of the middle frame 600 corresponding to the light transmitting area DA of the cover window 100.

The kind of the camera is not particularly limited, and a known camera may be used. In an exemplary embodiment, a known camera modulated to be applied to a portable terminal may be used, for example.

The lower cover 900 may be disposed under the middle frame 600. The lower cover 900 may be engaged and fixed to the middle frame 600. The lower cover 900 may form a lower appearance of the display device 1000. The lower cover 900 may include plastic, and/or metal.

As described above, the protective film in an exemplary embodiment may include a first protective member, an adhesive layer, and a second protective member, and may include at least one cut line provided to be spaced apart from the second protective film and a bridge portion. The cut line may include at least an adhesive layer and may cut the first protective film and at least a part of the adhesive layer. Therefore, the protective film may prevent the permeation of foreign matter that may be generated in the cut line of the adhesive layer.

Further, the cover window in an exemplary embodiment may include the protective film to prevent the occurrence of foreign matter in the cut area of the adhesive layer to minimize appearance failure.

In concluding the detailed description, those skilled in the art will appreciate that many variations and modifications may be made to the preferred embodiments without substantially departing from the principles of the invention. Therefore, the disclosed preferred embodiments of the invention are used in a generic and descriptive sense only and not for purposes of limitation.

What is claimed is:

1. A protective film, comprising:
a first protective member;
an adhesive layer disposed on the first protective member;
a second protective member disposed on at least a part of the adhesive layer;
at least one cut line which is defined in the first protective member, is not defined in the second protective member, is spaced apart from the second protective member, faces the second protective member in a plan view, and includes ends spaced apart from each other in the plan view; and
at least one bridge portion disposed in an area in which the at least one cut line is not defined.

2. The protective film of claim 1,
wherein the at least one cut line extends in a direction perpendicular to an upper surface of the adhesive layer, and
the adhesive layer includes a cut area in which at least a part thereof is cut and overlaps the at least one cut line.

3. The protective film of claim 2,
wherein the at least one cut line extends to a lower surface of the first protective film, and
the first protective member includes the cut area in which at least a part thereof is cut.

4. The protective film of claim 3,
wherein the first protective member and the adhesive layer are not cut in an area overlapping the at least one bridge portion.

5. The protective film of claim 2,
wherein an interval between the second protective member and the at least one cut line has a range of 0.1 millimeter to 0.3 millimeter.

6. The protective film of claim 5, further comprising:
a first area in which the second protective member is disposed and a second area other than the first area with respect to the at least one cut line,
wherein
the at least one bridge portion is disposed between the first area and the second area.

7. The protective film of claim 6,
wherein the at least one cut line includes a first cut line, and a second cut line spaced apart from the first cut line, and
the at least one bridge portion includes a first bridge portion disposed between a first end of the first cut line and a second end of the second cut line, and a second bridge portion disposed between a third end of the first cut line and a fourth end of the second cut line.

8. The protective film of claim 7,
wherein the second end of the second cut line is placed on an extension line of the first end of the first cut line.

9. The protective film of claim 7,
wherein an extension line of the third end of the first cut line is spaced apart from an extension line of the fourth end of the second cut line in a direction different from an extension direction.

10. The protective film of claim 2,
wherein a width of the at least one bridge portion has a range of about 2 millimeters to about 5 millimeters.

11. The protective film of claim 10, further comprising:
a sub-cut line connecting both ends of the at least one cut line,
wherein the sub-cut line extends in a direction perpendicular to the upper surface of the adhesive layer and is spaced apart from a lower surface of the adhesive layer.

12. The protective film of claim 11,
wherein the sub-cut line has a shape symmetrical to the at least one cut line with respect to a reference line across both of the ends of the at least one cut line, and overlaps at least a part of the second protective member.

13. A cover window, comprising:
a base layer;
a first print layer disposed on one surface of the base layer and including at least one first hole for exposing at least a part of the one surface; and
a protective film at least partially disposed on the first print layer, the protective film including:
a first protective member disposed on the one surface of the base layer;
a second protective member disposed between the first protective film and the one surface and overlapping at least a part of the first print layer;
an adhesive layer disposed between the first protective member and the second protective member;
at least one cut line which is defined in the first protective member, spaced apart from the second protective member, is not defined in the second protective member, faces the second protective member in a plan view, and includes ends spaced apart from each other in the plan view; and at least one bridge portion disposed in an area in which the at least one cut line is not defined.

14. The cover window of claim 13,
wherein the one surface of the first print layer is in contact with the adhesive layer and the second protective member, and an area of the first print layer overlapping the at least one cut line is spaced apart from the at least one cut line.

15. The cover window of claim 14,
wherein the at least one cut line extends in a direction perpendicular to an upper surface of the adhesive layer, and
the adhesive layer includes a cut area in which at least a part thereof is cut and overlaps the at least one cut line.

16. The cover window of claim 15,
wherein the first protective member and the adhesive layer are not cut in an area overlapping the at least one bridge portion.

17. The cover window of claim 14,
wherein a thickness of the second protective member has a range of about 0.05 millimeter to about 0.10 millimeter.

18. The cover window of claim 13,
wherein the base layer includes a light blocking area in which the first print layer is disposed, and a light transmitting area other than the light blocking area.

19. The cover window of claim 18,
wherein the protective film is disposed on the light blocking area and the light transmitting area,
the at least one first hole is defined in the light blocking area, and
the second protective member is disposed to cover the at least one first hole.

20. The cover window of claim 19, further comprising:
a second print layer disposed in the light transmitting area,
wherein the second print layer includes at least one second hole which exposes at least a part of the one surface of the base layer, and
the second protective member covers the second hole.

* * * * *